(12) United States Patent
Ikeda

(10) Patent No.: US 8,557,655 B2
(45) Date of Patent: Oct. 15, 2013

(54) SEMICONDUCTOR DEVICE AND METHOD OF MANUFACTURING THE SAME

(75) Inventor: Harumi Ikeda, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/027,655

(22) Filed: Feb. 15, 2011

(65) Prior Publication Data
US 2011/0143515 A1 Jun. 16, 2011

Related U.S. Application Data

(62) Division of application No. 12/182,614, filed on Jul. 3, 2008, now Pat. No. 8,436,424.

(30) Foreign Application Priority Data

Aug. 9, 2007 (JP) ................................. 2007-207418

(51) Int. Cl.
*H01L 21/336* (2006.01)

(52) U.S. Cl.
USPC .................. 438/238; 438/382; 257/E21.044; 257/E21.444

(58) Field of Classification Search
USPC ................ 438/275, 238, 283, 475, 216, 382; 257/407, 412, E21.444, E21.635, 379, 257/E21.004
See application file for complete search history.

(56) References Cited

U.S. PATENT DOCUMENTS

| | | | |
|---|---|---|---|
| 5,744,397 A | 4/1998 | Sheen | |
| 6,093,628 A | 7/2000 | Lim | |
| 6,165,861 A * | 12/2000 | Liu et al. | 438/382 |
| 6,406,956 B1 | 6/2002 | Tsai et al. | |
| 6,509,225 B2 | 1/2003 | Moriwaki et al. | |
| 6,967,379 B2 * | 11/2005 | Matsuo | 257/369 |
| 7,538,397 B2 * | 5/2009 | Kotani | 257/380 |
| 7,675,125 B2 | 3/2010 | Park et al. | |
| 7,859,059 B2 * | 12/2010 | Takahashi | 257/369 |
| 2002/0151148 A1 * | 10/2002 | Racanelli | 438/385 |
| 2003/0013385 A1 * | 1/2003 | Kim et al. | 451/41 |
| 2006/0003571 A1 * | 1/2006 | Lee et al. | 438/618 |
| 2006/0035426 A1 * | 2/2006 | Weiss et al. | 438/199 |
| 2006/0081959 A1 | 4/2006 | Dondero et al. | |
| 2006/0228843 A1 * | 10/2006 | Liu et al. | 438/197 |
| 2007/0052034 A1 * | 3/2007 | Yu et al. | 257/365 |
| 2007/0184606 A1 * | 8/2007 | You et al. | 438/211 |
| 2008/0149826 A1 * | 6/2008 | Renau et al. | 250/288 |
| 2008/0160880 A1 * | 7/2008 | Ma et al. | 451/36 |

(Continued)

FOREIGN PATENT DOCUMENTS

| | | |
|---|---|---|
| JP | 62-118568 | 5/1987 |
| JP | 2000-195966 | 7/2000 |

(Continued)

*Primary Examiner* — Matthew Landau
*Assistant Examiner* — Joseph C Nicely
(74) *Attorney, Agent, or Firm* — Dentons US LLP

(57) ABSTRACT

A semiconductor device with first and second groups of transistors, the second group transistors each having a lower operating voltage than that of each of said transistors in said first group, the first group transistors have first gate electrodes formed from a silicon based material layer on a semiconductor substrate through a first gate insulating film, the second group transistors have second gate electrodes formed such that metal based gate materials are respectively filled in gate formation trenches formed in an interlayer insulating film on the semiconductor substrate through a second gate insulating film, and a resistor on the substrate has a resistor main body utilizing the silicon based material layer and is formed on the substrate through an insulating film.

3 Claims, 34 Drawing Sheets

(56) References Cited

U.S. PATENT DOCUMENTS

| | | |
|---|---|---|
| 2008/0173947 A1* | 7/2008 | Hou et al. ............... 257/369 |
| 2008/0280406 A1 | 11/2008 | Ema et al. |
| 2009/0166555 A1* | 7/2009 | Olson et al. ............. 250/427 |
| 2010/0012917 A1 | 1/2010 | Takaura et al. |
| 2010/0173471 A1 | 7/2010 | Sugimae et al. |
| 2010/0252873 A1* | 10/2010 | Cheng ..................... 257/301 |
| 2010/0320559 A1* | 12/2010 | Hirose et al. ............ 257/506 |
| 2011/0117710 A1* | 5/2011 | Lin et al. ................. 438/238 |

FOREIGN PATENT DOCUMENTS

| | | |
|---|---|---|
| JP | 2001-102443 | 4/2001 |
| JP | 2002-334938 | 11/2002 |
| JP | 2004-006475 | 1/2004 |
| JP | 2004-241444 | 8/2004 |
| JP | 2005-228868 | 8/2005 |
| JP | 2006-140391 | 6/2006 |
| JP | 2007-123431 | 5/2007 |

* cited by examiner

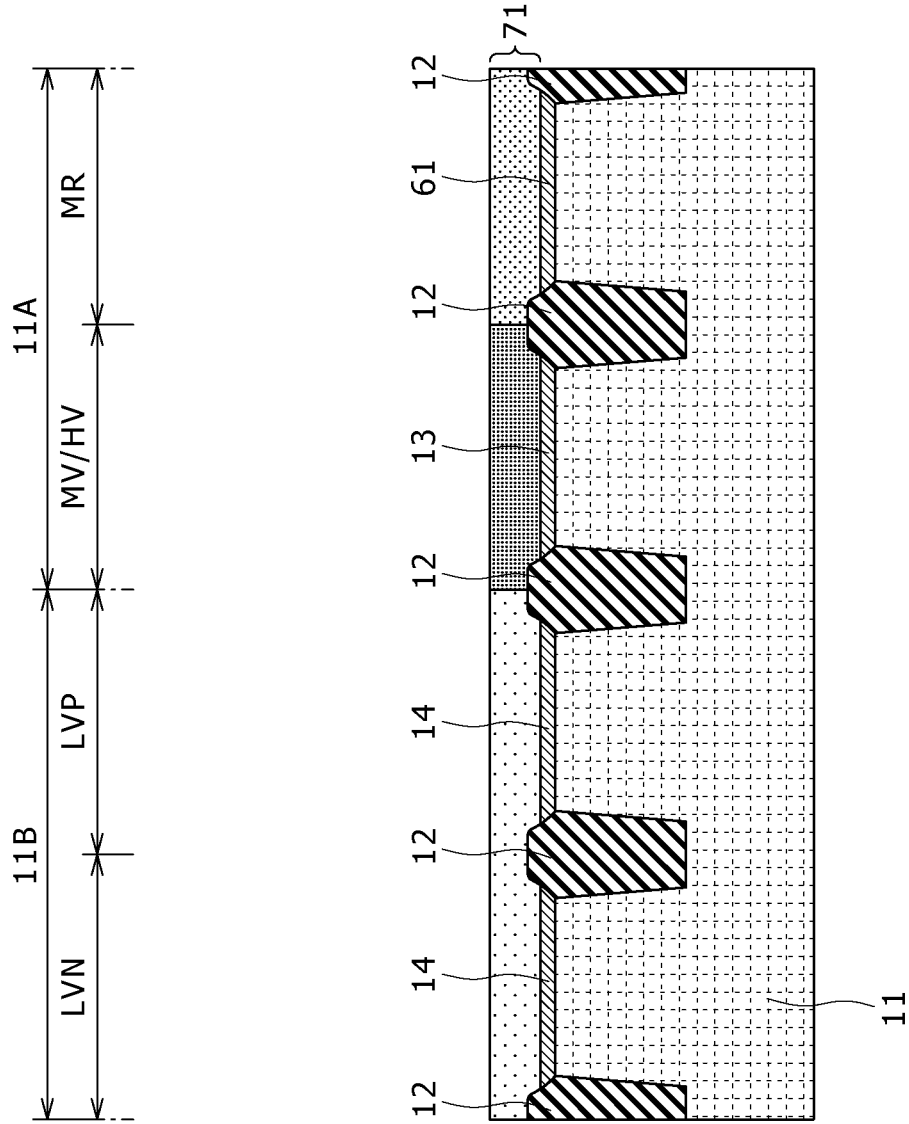

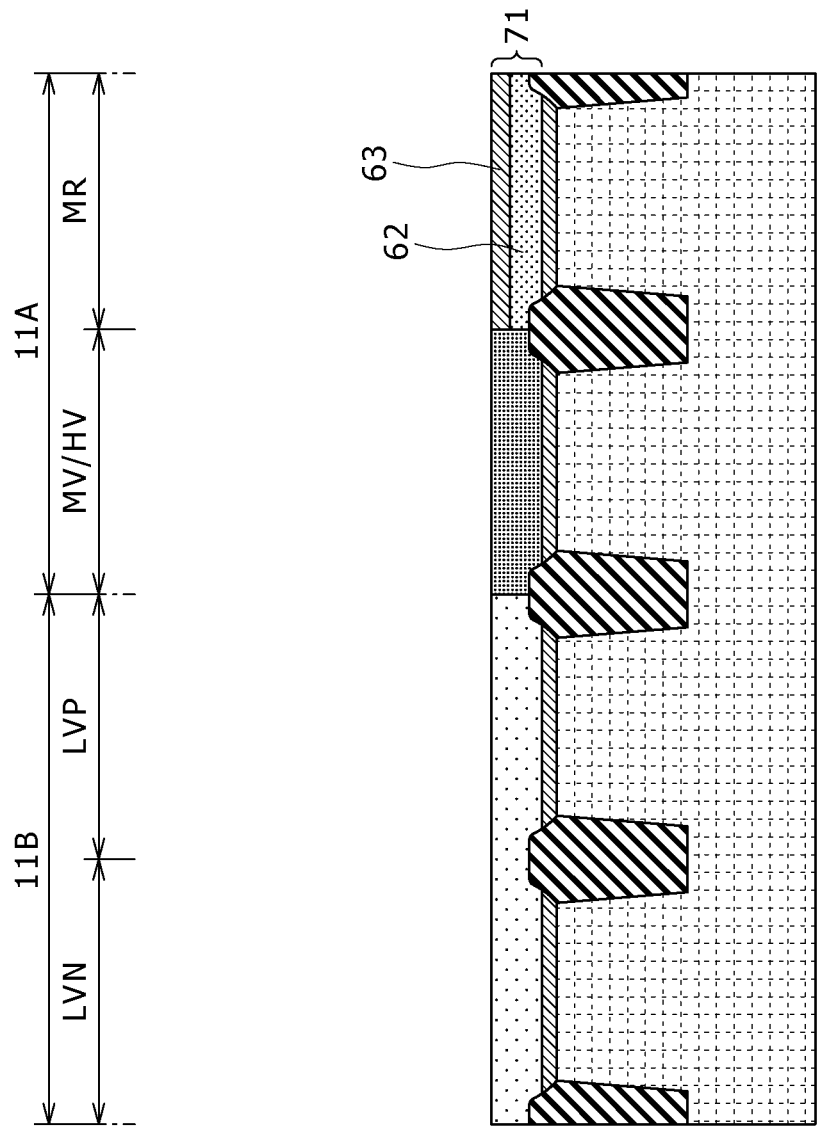

Related Art

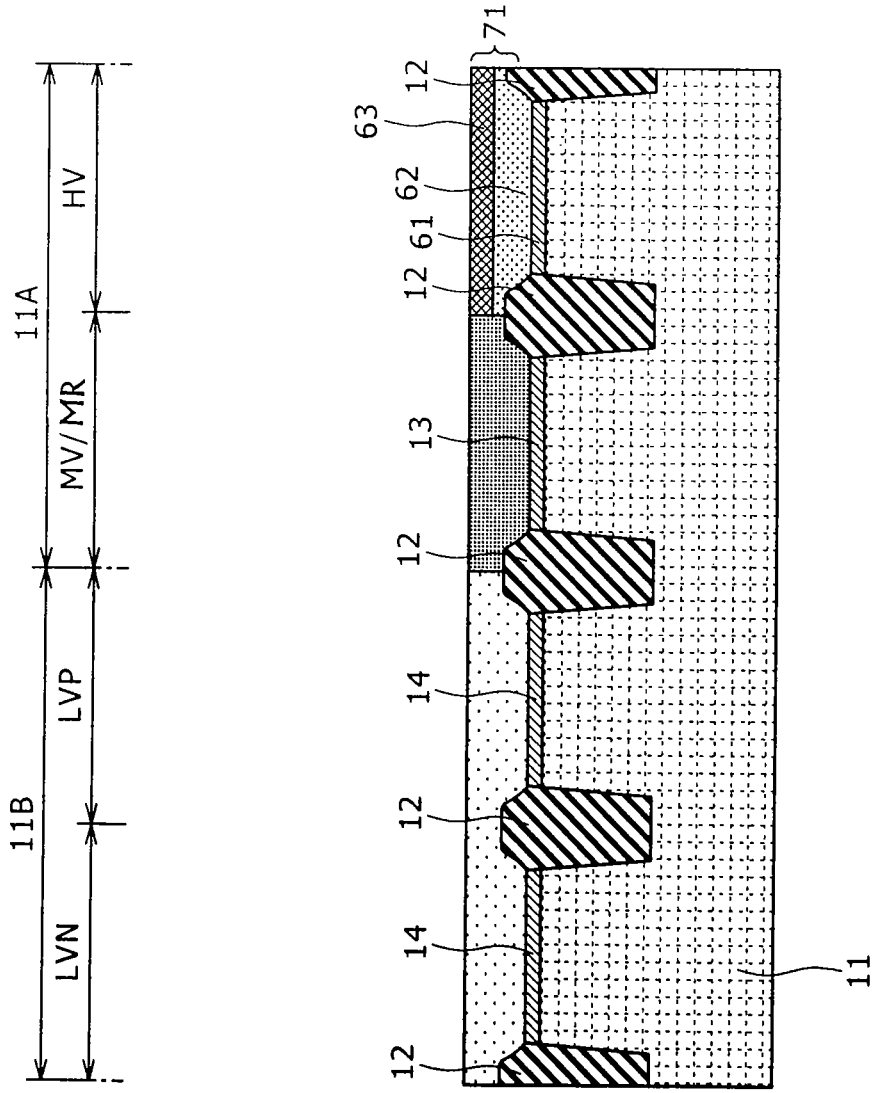

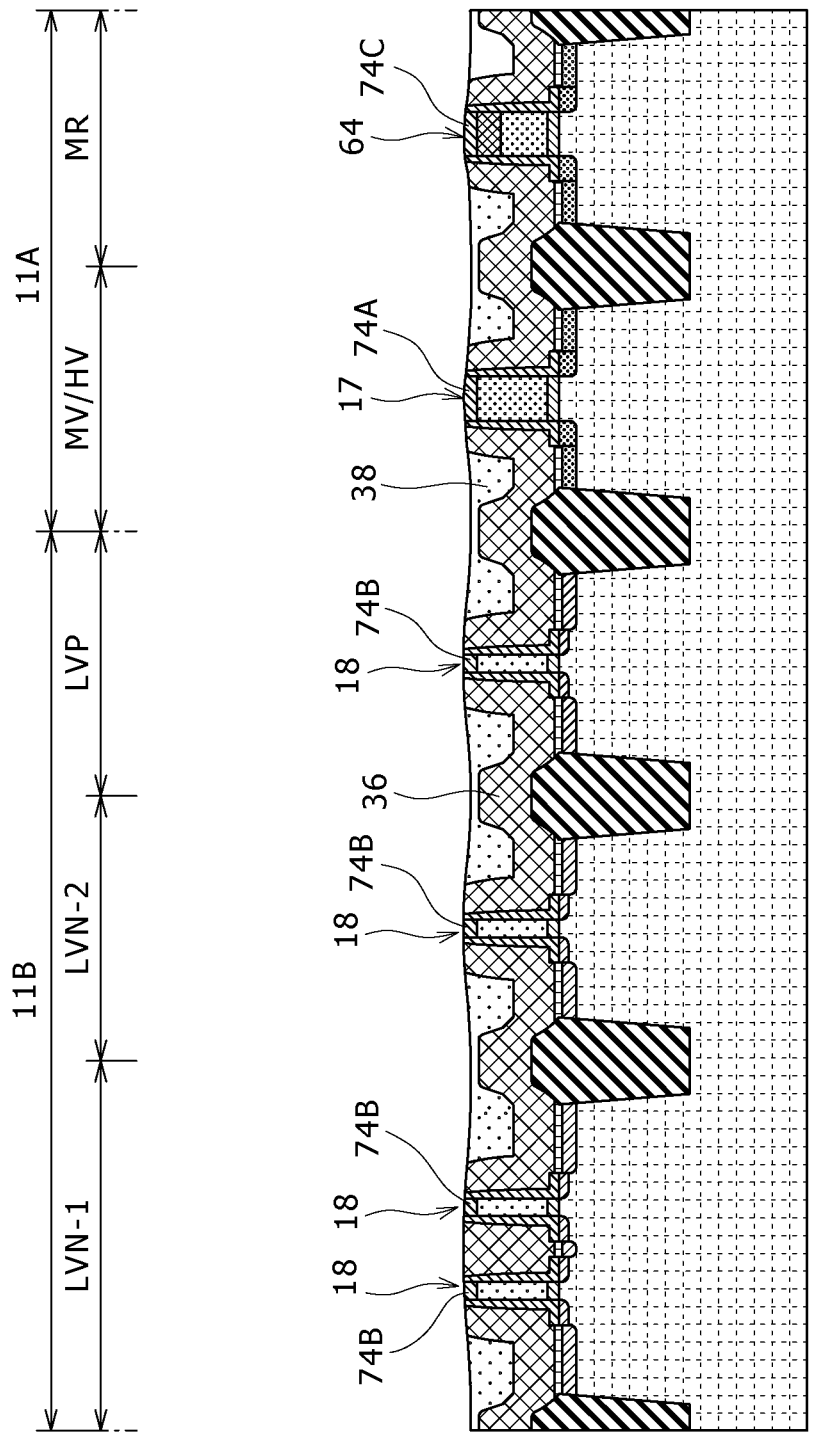

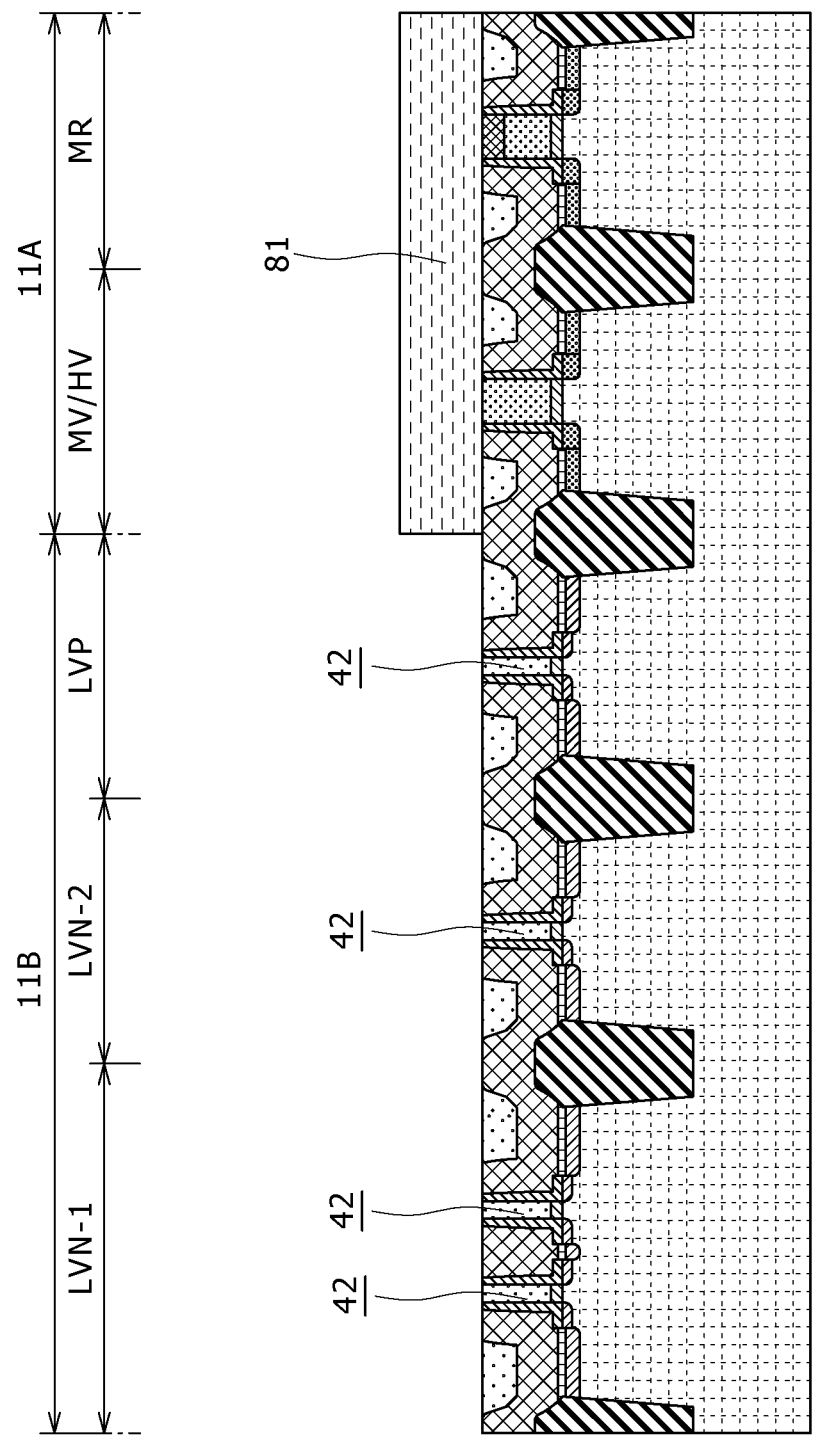

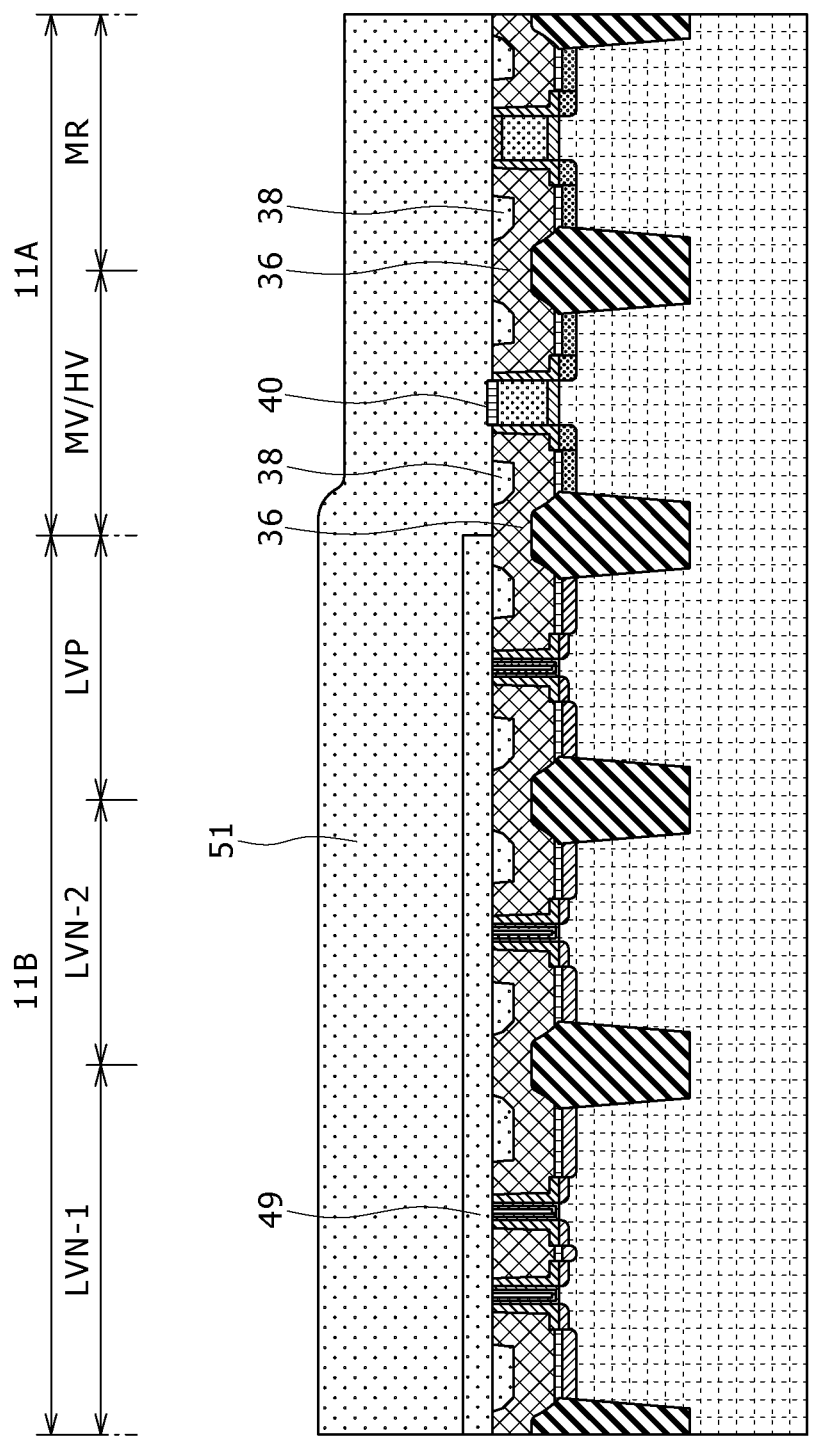

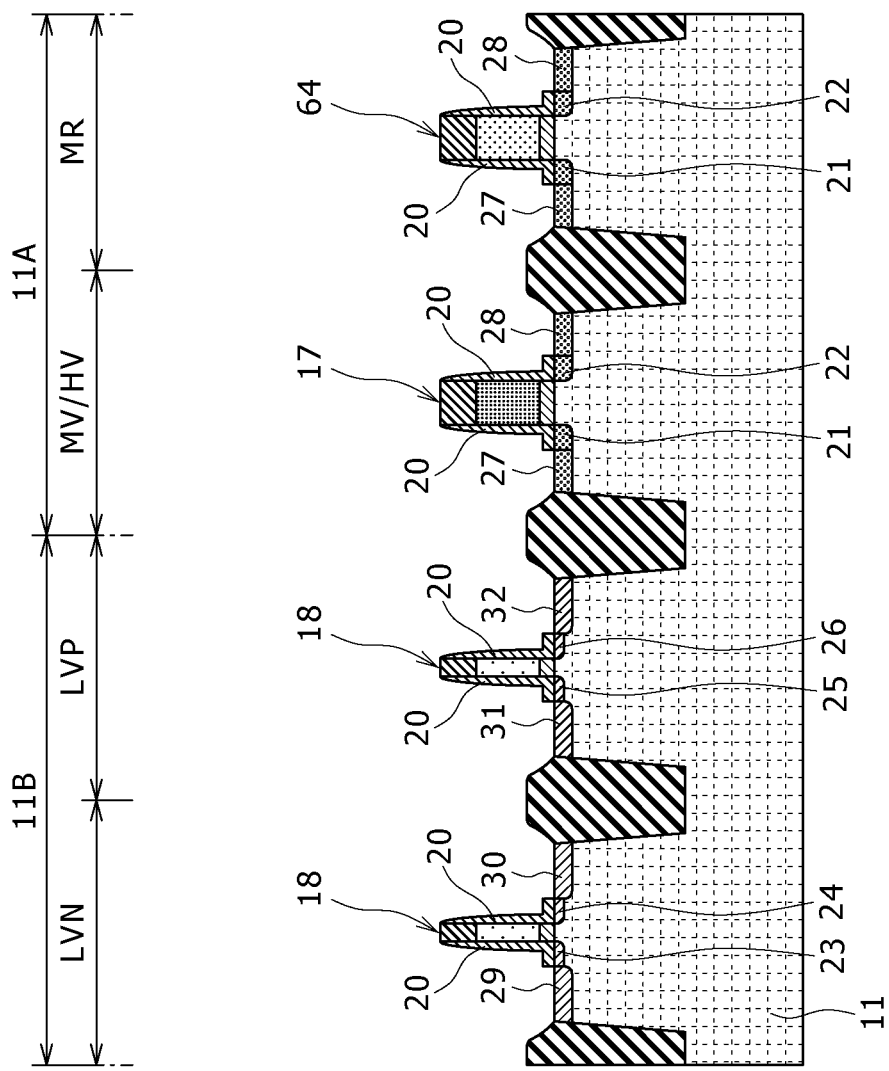
Related Art FIG. 9C

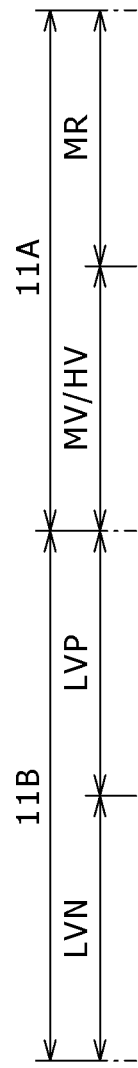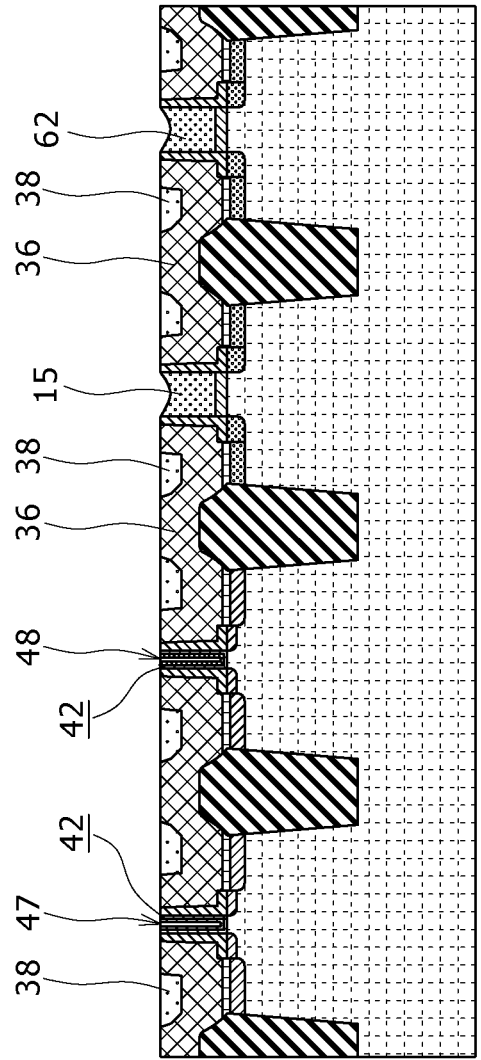
Related Art FIG. 9H

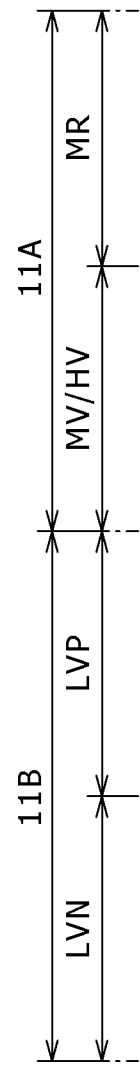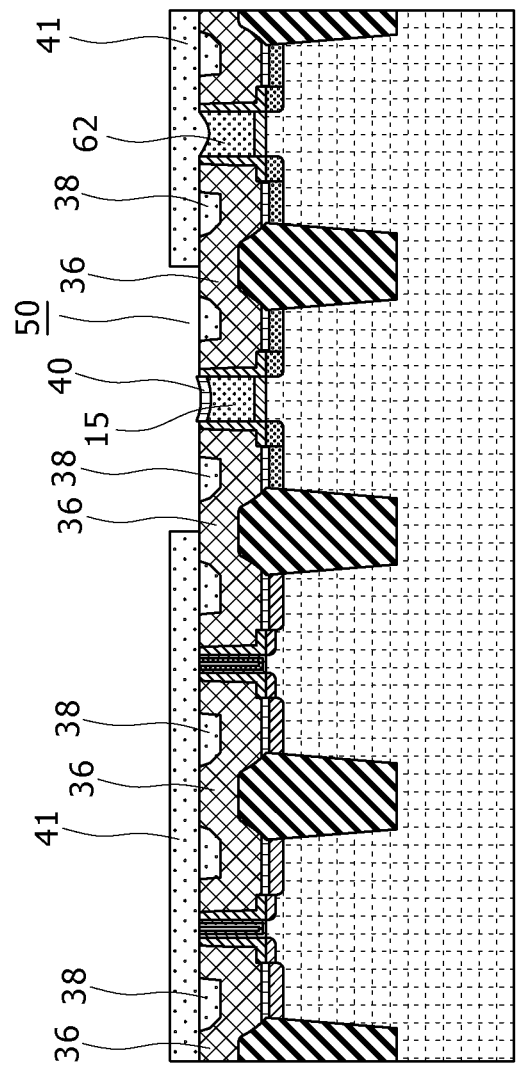
Related Art FIG. 9I

SEMICONDUCTOR DEVICE AND METHOD OF MANUFACTURING THE SAME

RELATED APPLICATION DATA

This application is a division of U.S. patent application Ser. No. 12/182,614, filed Jul. 30, 2008, the entirety of which is incorporated herein by reference to the extent permitted by law. The present application claims the benefit of priority to Japanese Patent Application No. JP 2007-207418 filed in the Japan Patent Office on Aug. 9, 2007, the entirety of which is incorporated by reference herein to the extent permitted by law.

BACKGROUND OF THE INVENTION

1. Field of the Invention

The present invention relates to a semiconductor device in which a transistor different in operating voltage from one another and a resistor are embedded on the same semiconductor substrate, and a method of manufacturing the same.

2. Description of the Related Art

An increase in gate leakage current in silicon oxide system gate insulating film, and deplation in a polysilicon based gate electrode have become problems with promotion of high integration of MISFETs. As measures taken to cope with such problems, adoption of a gate stack structure having a gate insulating film having a higher permittivity larger than that of a silicon oxide, and a metallic gate (hereinafter referred to as "a high permittivity film/metallic gate") is discussed for high-speed operation and low-power consumption MIS type transistors. However, utilizing a normal manufacturing method results in that a heat history after the high permittivity film/metallic gate is formed is high. As a result, there is encountered such a problem that the characteristics and reliability of the high-permittivity insulating film are deteriorated, and a value of a work function of the metallic gate shifts from a design value.

In order to solve this problem, a buried gate (for example, a damascene gate) structure is proposed. This buried gate structure is obtained by completing a prime heat treatment process necessary for transistor formation before the high permittivity film/metallic gate is formed. The technique relating to this buried gate structure, for example, is described in Japanese Patent Laid-Open No. 2001-102443. A method of forming this buried gate structure when a metallic electrode, for example, is used is described as follows. That is to say, a gate insulating film and a gate electrode portion are removed once after a transistor structure having a silicon oxide system gate insulating film and a polysilicon based gate electrode is formed, and a metal system oxide film and a metallic electrode are newly buried therein. According to this method, the metallic electrode is prevented from being deteriorated because the heat treatment necessary for the transistor formation is completed before completion of the formation of the metallic electrodes.

However, the high-speed operation and the low-power consumption are required for the actual semiconductor devices. For this reason, in order to meet these requirements, a transistor adopting the metal system oxide film and the metallic electrode, and a transistor adopting a conventional silicon oxide system gate insulating film and the polysilicon based gate electrode of the related art for the high voltage operation are mixedly formed in the actual semiconductor device. Therefore, the damascene gate structure having the high permittivity film/metallic gate for the high-speed operation and low-voltage operation, and a gate structure having a thicker gate insulating film showing a high withstand voltage must be formed on the same semiconductor substrate of the same chip in the embedded manner.

Moreover, in addition to the transistor adopting the metal system oxide film and the metallic electrode, and the transistor adopting the silicon oxide system gate insulating film and the polysilicon based gate electrode of the related art for the high-voltage operation, a polysilicon resistor needs to be embedded on the semiconductor substrate. An example of a method of manufacturing the semiconductor device in the related art will now be described with reference to cross sectional views, showing manufacturing process, of FIGS. 9A to 9I.

As shown in FIG. 9A, device isolation regions 12 are formed in a semiconductor substrate 11 by carrying out a device isolation process. In this case, for example, a region LVN and a region LVP in which low-voltage transistors (such as MISFETs) are intended to be formed, respectively, a region MV/HV in which a middle-voltage transistor and a high-voltage transistor (such as MISFETs) are intended to be formed, and a region MR in which a resistor is intended to be formed are isolated from one another by these device isolation regions 12. Also, both the region MV/HV and the region MR are given as a generic name of a first region 11A, and both the region LVN and the region LVP are given as a generic name of a second region 11B. Regions on the semiconductor substrate 11 which are isolated from one another by these device isolation regions 12 become active regions, respectively.

Next, an ion implantation for forming a P-type well region (not shown), an ion implantation for forming a buried layer (not shown) for blocking punch-through of a MISFET, and an ion implantation for adjusting a threshold voltage ($V_{th}$) are suitably performed for a region in which an N-channel MISFET is intended to be formed, thereby an NMOS channel is formed. In addition, an ion implantation for forming an N-type well region, an ion implantation for forming a buried layer (not shown) for blocking punch-through of a MISFET, and an ion implantation for adjusting a threshold voltage ($V_{th}$) are suitably performed for a region in which a P-channel MISFET is intended to be formed, thereby a PMOS channel region is formed. At this time, the ion implantation may be performed for the region MV/HV in which the middle-voltage transistor and the high-voltage transistor are intended to be formed, and the regions LVN and LVP in which the low-voltage transistors are intended to be formed under the respective ion implantation conditions.

Next, a gate insulating film 13 is formed on the surface of the region MV/HV of the semiconductor substrate 11. The high-voltage transistor and the middle-voltage transistor tend to have thick gate insulating films, respectively, in many cases. Thus, the gate insulating film 13, for example, is formed from a silicon oxide film. The silicon oxide film is formed by, for example, performing the thermal oxidation at 750 to 900° C. to have a thickness of 2 to 4 nm. The gate insulating film 13 is formed on each of the active regions of the region MR of the first region 11A, and the second region 11B concurrently with the formation of that gate insulating film 13 on the surface of the region MV/HV. In this case, however, the gate insulating film 13 is used as an insulating film 61 in the region MR and is also used as a dummy gate insulating film 14 in the second region 11B.

Next, a silicon based material layer 71 from which a first gate electrode, a resistor main portion, and dummy gate electrodes are each intended to be formed is formed on the gate insulating film 13, the insulating film 61, and the dummy gate insulating films 14. The silicon based material layer 71 is formed over the entire surface by, for example, depositing a polysilicon, amorphous silicon or silicon germanium layer over the entire surface through the gate insulating film 13, the insulating film 61, and the dummy gate insulating films 14 on the semiconductor substrate 11. When the silicon based material layer 71, for example, is formed from the polysilicon layer, a low-pressure CVD (LP-CVD) method is utilized. In this case, monosilane ($SiH_4$) is used as a raw material gas and a deposition temperature is set at 580 to 620° C. Under this condition, the polysilicon layer is deposited to have a thickness of 100 to 150 nm, for example, 150 nm.

Next, there is performed an ion implantation process for reducing a gate resistance. By utilizing a resist application technique and a lithography technique, a resist film (not shown) is formed on the silicon based material layer 71, and an opening portion is formed so as to expose the region MV/HV in the first region 11A. Subsequently, in order to reduce the gate resistance of the silicon based material layer 71 in the region MV/HV, an ion implantation is performed for the silicon based material layer 71 in the region MV/HV. As an example, in the case of the P-channel MISFET, boron (B) ions are implanted into the silicon based material layer 71 in the region MV/HV at an implantation energy of 5 keV with a dose of $8 \times 10^{15}/cm^2$. On the other hand, in the case of the N-channel MISFET, phosphorus (P) ions are implanted into the silicon based material layer 71 in the region MV/HV at an implantation energy of 10 keV with a dose of $8 \times 10^{15}/cm^2$. The ion implantation condition is merely an example, and thus the condition can be suitably selected. After that, the resist film described above is removed away by, for example, performing ashing and by using a mixed liquid of a sulfuric acid and a hydrogen peroxide.

Next, likewise, by utilizing the resist application technique and the lithography technique, a resist film (not shown) is formed on the silicon based material layer 71, and an opening portion is formed so as to expose the region MR in the first region 11A. Subsequently, in order to determine a resistance value of the silicon based material layer 71 in the region MR, an ion implantation is performed for the silicon based material layer 71 in the region MR. As an example, boron (B) ions are implanted into the silicon based material layer 71 in the region MR at an implantation energy of 15 keV with a dose of $3 \times 10^{15}/cm^2$. The ion implantation condition is merely an example, and thus the condition can be suitably selected. After that, the resist film described above is removed away by, for example, performing the ashing and by using the mixed liquid of a sulfuric acid and a hydrogen peroxide.

As shown in FIG. 9B, a hard mask layer 74 is formed on the silicon based material layer 71 (refer to FIG. 9A). A silicon nitride (SiN) layer is deposited to have a thickness of, for example, about 50 to about 100 nm by, for example, utilizing the LP-CVD method, thereby forming the hard mask layer 74. In this case, the silicon nitride layer is formed to have the thickness of 80 nm.

Next, by utilizing the resist application technique and the lithography technique, a resist pattern (not shown) for formation of the first gate electrode and the dummy gate electrodes is formed on the hard mask layer 74. After that, the hard mask layer 74 is processed with the resist pattern as an etching mask by, for example, utilizing an anisotropic etching method, thereby forming a hard mask 74A for formation of the first gate electrodes of the high-voltage transistor and the middle-voltage transistor, and hard masks 74B for formation of the dummy gate electrodes of the low-voltage transistors, and a hard mask 74C for formation of the resistor in the first region 11A, the second region 11B, and the first region 11A, respectively. In the anisotropic etching method, hydrogen bromide (HBr) chlorine (Cl) system gas, for example, is used as etching gas. Moreover, dummy gate electrodes 16, and a resistor main body 62 are formed in the second region 11B and in the first region 11A, respectively, at the same time that a first gate electrode 15 is formed in the first region 11A by using the hard masks 74A, 74B and 74C as an etching mask. At this time, the gate insulating film 13, the dummy gate insulating films 14, and the insulating film 61 are partially etched away.

In such a manner, a gate portion 17 is composed of the hard mask 74A, the first gate electrode 15, and the gate insulating film 13. Each of dummy gate portions 18 is composed of the hard mask 74B, the dummy gate electrode 16, and the dummy gate insulating film 14. Also, a resistor portion 64 is composed of the hard mask 74C, the resistor main body 62, and the insulating film 61.

Next, as shown in FIG. 9C, sidewall portions of the gate portion 17, the dummy gate portions 15 and the resistor portion 64 are oxidized. Moreover, offset spacers (not shown) are formed on the sidewall portions of the gate portion 17, the dummy gate portions 15 and the resistor portion 64, respectively. Next, extension regions 21 and 22 are formed on a surface side of the semiconductor substrate 11 and below both sides of each of the gate portion 17 and the resistor portion 64 in the first region 11A, respectively. Extension regions 23 and 24 of an N-channel MISFET are formed on the surface side of the semiconductor substrate 11 and below both sides of the dummy gate portion 18 of the region LVN in the second region 11B, respectively. Also, extension regions 25 and 26 of a P-channel MISFET are formed on the surface side of the semiconductor substrate 11 and below both sides of the dummy gate portion 18 of the region LVP in the second region 11B, respectively.

Next, sidewalls 20 are formed on side portions of the gate portion 17, the dummy gate portions 18, and the resistor portion 64 through the offset spacers (not shown), respectively.

Next, source/drain regions 27 and 28 are formed on the surface side of the semiconductor substrate 11 and below the both sides of each of the gate portion 17 and the resistor portion 64 in the first region 11A through the corresponding ones of the extension regions 21 and 22, respectively. In addition, source/drain regions 29 and 30 are formed on the surface side of the semiconductor substrate 11 and below the both sides of the dummy gate portion 18 of the region LVN in the second region 11B through the extension regions 23 and 24, respectively. Moreover, source/drain regions 31 and 32 are formed on the surface side of the semiconductor substrate 11 and below the both sides of the dummy gate portion 18 of the region LVP in the second region 11B through the extension regions 25 and 26, respectively.

Next, as shown in FIG. 9D, a silicide layer 33 is formed on each of the source/drain regions 27 to 32. After that, an interlayer insulating film is formed over the entire surface of the semiconductor substrate 11 so as to cover the gate portion 17, the dummy gate portions 18, the resistor portion 64, and the like. Before this process, firstly, a liner film 36 is formed over the entire surface of the semiconductor substrate 11, and a first interlayer insulating film 38 becoming that interlayer insulating film is formed on the liner film 36. Next, the first interlayer insulating film 38 and the liner film 36 which are formed so as to cover the gate portion 17, the dummy gate portions 18, the resistor portion 64 and the like are polished by utilizing a chemical mechanical polishing (CMP) method until the hard masks 74A, 74B and 74C are exposed. At this time, the hard masks 74A, 74B and 74C are left.

As shown in FIG. 9E, the hard mask 74A (refer to FIG. 9D) on the first gate electrode 15 in the first region 11A, the hard masks 74B (refer to FIG. 9D) on the dummy gate electrodes 16 in the second region 11B, and the hard mask 74C (refer to FIG. 9D) on the resistor main body 62 in the first region 11A are removed away by utilizing either a dry etching method or the CMP method. When the hard masks 74A, 74B and 74C are removed away by, for example, utilizing the CMP method, the surfaces of the first gate electrode 15, the dummy gate electrodes 16, the resistor main body 62, the first interlayer insulating film 38, the liner film 36, the sidewalls 20, and the like are planarized to have approximately the same flat surface-like shape.

As shown in FIG. 9F, an etching mask (not shown) is formed so as to cover the first region 11A by utilizing the resist application technique and the lithography technique. Also, the dummy gate electrodes 16 (refer to FIG. 9E) are removed away by, for example, utilizing a dry etching method, thereby forming trenches 42 for gate formation, respectively. After that, the etching mask is removed away. Moreover, the dummy gate insulating films 14 (refer to FIG. 9B) are removed away by utilizing a wet etching method using a dilute hydrofluoric acid, thereby completing the trenches 42 for gate formation, respectively. At this time, upper portion of the first interlayer insulating film 38 is also etched away.

As shown in FIG. 9G, a second gate insulating film 43 is formed on each of inner surfaces of the trenches 42 for gate formation. Next, a hafnium silicide (HfSi$_x$) layer is deposited in the region LVN through the second gate insulating film 43 so as to be formed on each of the inner surfaces of the trenches 42 for gate formation to have a thickness of, for example, about 10 to about 100 nm, thereby forming a work function controlling film 44 for determining a work function. In addition, a titanium nitride (TiN) layer is deposited in the region LVP to have a thickness of about 5 to about 50 nm, thereby forming a work function controlling film 45 for determining a work function.

Next, a conductive film 46 made of a conductive material is formed so as to be filled in each of the insides of the trenches 42 for gate formation. The conductive film 46, for example, is made of tungsten (W) as a metallic material having a lower electrical resistance value than that of each of the work function controlling films 44 and 45.

As shown in FIG. 9H, there is removed the extra conductive film 46 (refer to FIG. 9G) other than the conductive film 46 filled in each of the insides of the trenches 42 for gate formation. This removal process is carried out by, for example, utilizing the CMP method. In the phase of utilizing the CMP method, the liner film 36, the first interlayer insulating film 38, and the like serve as a polishing stopper. As a result, the second gate electrode 47 of the low-voltage transistor (N-channel MISFET) in the second region 11B is formed from the conductive film 46 and the work function controlling film 44 which are left in the corresponding one of the trenches 42 for gate formation. Also, the second gate electrode 48 of the low-voltage transistor (P-channel MISFET) in the second region 11B is formed from the conductive film 46 and the work function controlling film 45 which are left in the corresponding one of the trenches 42 for gate formation.

Although the second gate electrode 48 is formed in the second region 11B by utilizing the CMP method, at this time, trimmed portions are generated in the silicon based materials of which the resistor main body 62 in the region MR, and the first gate electrode 15 in the region MV/HV are made, respectively. Since an amount of trimming, for example, is not constant within the surface of the semiconductor substrate 11, there are caused a problem that the resistance value of the first gate electrode 15 increases, and a problem that the resistance values of the first gate electrode 15 and the resistor main body 62 disperse.

In addition, as shown in FIG. 9I, a protective film 41 is formed over all the surfaces of the first interlayer insulating film 38, the liner film 36, and the like. Also, an opening portion 50 is formed in a portion of the protective film 41 corresponding to the region MV/HV. Next, a nickel layer, for example, is formed as a metallic layer for formation of a silicide layer over the entire surface. Also, an rapid thermal anneal (RTA), for example, is performed at 350° C. for 30 seconds, so that the nickel layer is reacted with only silicon (Si) of the first gate electrode 15, thereby forming a silicide layer 40. After that, unreacted nickel is removed away by utilizing a wet etching method. Subsequently, a heat treatment is performed, thereby forming a nickel silicide (NiSi$_2$) layer having a low resistance value. This heat treatment, for example, is performed as the RTA at a temperature of 450° C. or less allowing reduction in resistance value for 30 seconds.

As has been described above, the formation of the silicide layer 40 on the first gate electrode 15 results in that the reduction in resistance value due to the formation of the silicide layer 40 compensates for the increase in resistance value due to the trimming of the upper portion of the first gate electrode 15. However, there still remains the problem that the resistance value of the resistor main body 62 having the trimmed upper portion disperses.

In addition, as shown in FIG. 10, the second gate electrodes 47 and 48 of the second region 11B are formed after the protective film 41 is formed in the first region 11A, thereby making it possible to solve the problem that the upper portions of the first gate electrode 15 and the resistor main body 62 are trimmed. Moreover, there is caused a problem that the conductive film 46 used to form the second gate electrodes 47 and 48 partially remains in an end portion of the protective film 41. As has been described above, the formation of the protective film 41 causes another problem that the conductive film 46 partially remains in the end portion of the protective film 41, and thus does not basically solve the problem that the upper portion of the resistor main body 62 is trimmed.

The technique described above, for example, is also described in Japanese Patent Laid-Open No. 2004-6475.

SUMMARY OF THE INVENTION

The problem to be solved is as follows. That is to say, in the semiconductor device in which a group of low-voltage operating transistors, a group of high-withstand voltage (high-voltage operating) transistors, and the resistor are formed on the same semiconductor substrate, when the metal system material is filled in each of the trenches for gate formation in which the low-voltage operating transistors are intended to be formed, respectively, thereby forming the gate electrodes, respectively, the upper portion of the resistor main body, made of the silicon based material, constituting the resistor is trimmed to disperse the resistance value.

In the light of the foregoing, it is therefore desire to provide a semiconductor device in which a group of low-voltage operating transistors, a group of high-withstand voltage (high-voltage operating) transistors, and a resistor are formed on the same semiconductor substrate, and in which a resistor having less dispersion in its resistance value can be formed even when a metal system material is filled in each of trenches for gate formation in which the group of low-voltage operating transistors are intended to be formed to form gate electrodes.

According to an embodiment of the present invention, there is provided a semiconductor device, including:

a first group of transistors;

a second group of transistors each having a lower operating voltage than that of each of the transistors in the first group; and a resistor formed on a semiconductor substrate;

wherein the first group of transistors have first gate electrodes each of which is formed from a silicon based material layer on the semiconductor substrate through a first gate insulating film;

the second group of transistors have second gate electrodes formed such that metal based gate materials are respectively filled in trenches for gate formation formed in an interlayer insulating film on the semiconductor substrate through a second gate insulating film; and the resistor has a resistor main body utilizing the silicon based material layer and formed on the semiconductor substrate through an insulating film, and a resistor protecting layer formed on the resistor main body.

According to another embodiment of the present invention, there is provided a method of manufacturing a semiconductor device, the semiconductor device including: a first group of transistors, a second group of transistors each having a lower operating voltage than that of each of the transistors in the first group, and a resistor formed on a semiconductor substrate;

the first group of transistors having first gate electrodes each of which is formed from a silicon based material layer on the semiconductor substrate through a first gate insulating film;

the second group of transistors having second gate electrodes formed such that metal system gate materials are respectively filled in trenches for gate formation formed by removing dummy gate portions on the semiconductor substrate through a second gate insulating film; and the resistor having a resistor main body utilizing the silicon based material layer formed through an insulating film formed to constitute the same layer as that of the first gate insulating film;

the manufacturing method including the steps of:

forming a resistor protecting layer in an upper portion of the silicon based material layer from which the resistor main body is formed;

etching the silicon based material layer having the upper portion in which the resistor protecting layer is formed, the silicon based material layer from which each of the first gate electrodes is formed, and the silicon based material layers from which the dummy gate portions are formed, respectively, by using a mask, thereby forming the resistor, the first gate electrodes and the dummy gate portions; and forming the second electrode.

According to the embodiment of the present invention, the second gate electrodes can be made of the metal system gate materials, respectively, and the resistance value of the resistor main body can be maintained at desired one because the resistor main body is protected by the resistor protecting layer. Accordingly, there is an advantage that it is possible to mount the resistor having the resistance value which can be set with high precision.

According to the another embodiment of the present invention, the second gate electrodes can be made of the metal based gate materials, respectively, and the resistance value of the resistor main body can be maintained at desired one because the resistor main body is prevented from being trimmed in the process for forming the second gate electrodes. Accordingly, there is an advantage that it is possible to set the resistance value of the resistor with high precision.

BRIEF DESCRIPTION OF THE DRAWINGS

FIGS. 2A to 2C are respectively cross sectional views showing manufacturing processes in a method of manufacturing the semiconductor device according to a first embodiment of the present invention;

FIGS. 5A and 5B are respectively cross sectional views showing manufacturing processes in a method of manufacturing a semiconductor device according to a second embodiment of the present invention;

FIGS. 9A to 9I are respectively cross sectional views showing an example according to a method of manufacturing a semiconductor device in the related art.

DETAILED DESCRIPTION OF THE PREFERRED EMBODIMENTS

A semiconductor device according to a first embodiment of the present invention will be described in detail hereinafter with reference to a schematically structural cross sectional view of FIG. 1.

Figure 1:
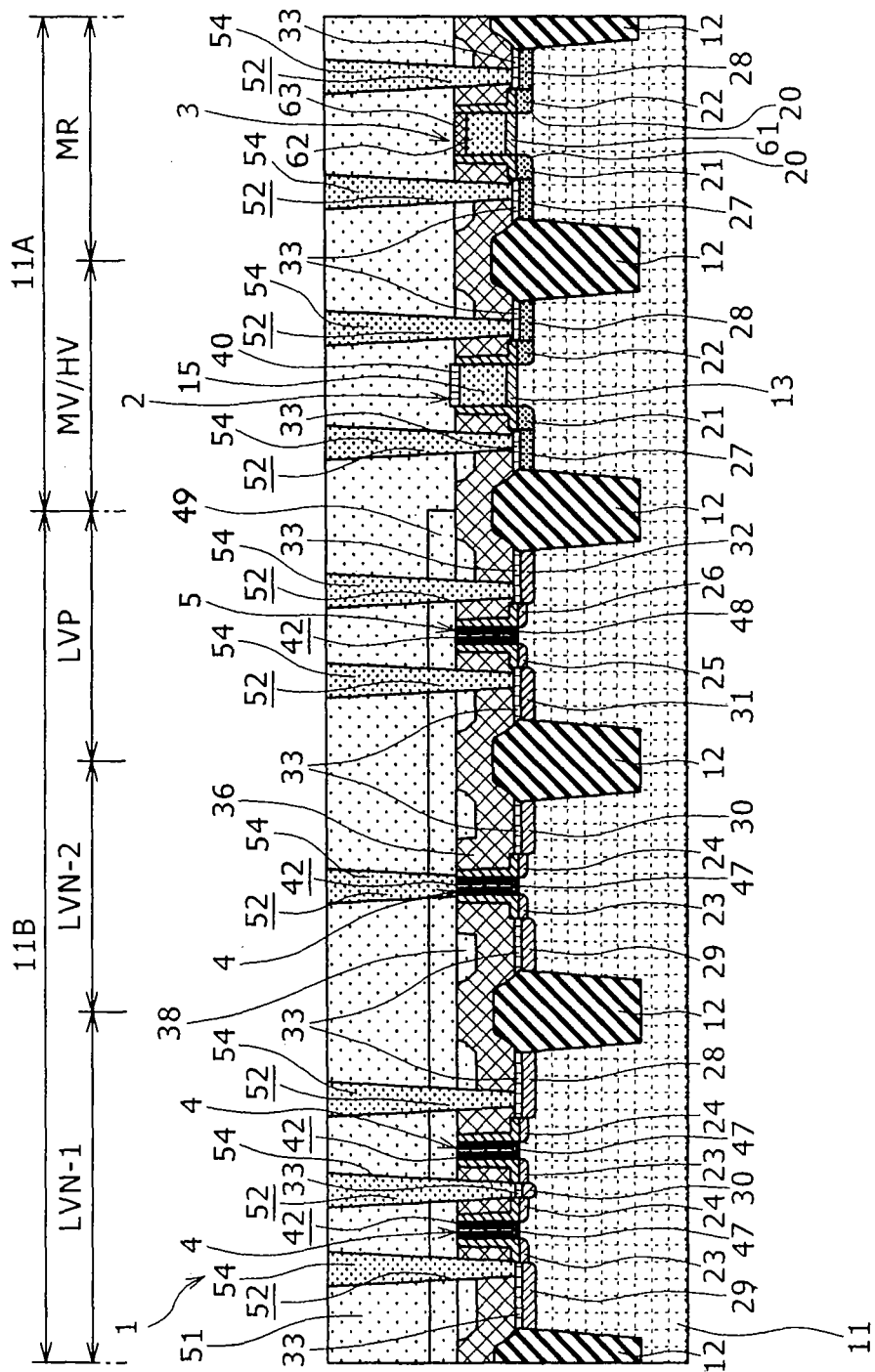
FIG. 1 is a cross sectional view schematically showing a structure of a semiconductor device according to a first embodiment of the present invention.

As shown in FIG. 1, device isolation regions 12 are formed in a semiconductor substrate 11. In this case, as an example, a region LVN-1, a region LVN-2, and a region LVP which have low-voltage transistors (such as MISFETs) formed therein, respectively, a region MV/HV having a middle-voltage transistor (such a MISFET) and a high-voltage transistor (such a MISFET) formed therein, and a region MR having a resistor formed therein are isolated from one another by these device isolation regions 12. The region MV/HV includes not only a region in which a pattern density of the MISFET is dense, but also a region having an isolated pattern. In addition, both the region MV/HV as the formation region of the high-voltage transistor and the middle-voltage transistor, and the region MR having a resistor formed therein are given a generic name of a first region 11A. Also, the region LVN-1 in which the N-channel MISFETs as the low-voltage transistors are densely formed, the region LVN-2 in which the N-channel MISFET as the low-voltage transistor is formed in isolation, and the region LVP in which the P-channel MISFET as the low-voltage transistor is formed are given as a generic name of a second region 11B.

In addition, in this specification, in each of the embodiments which will be described below, as an example, the low-voltage transistor means a transistor having an operating voltage lower than 1.5 V, the middle-voltage transistor means a transistor having an operating voltage equal to or higher than 1.5 V and lower than 3.3 V, and the high-voltage (high-withstand voltage) transistor means a transistor having an operating voltage equal to or higher than 3.3 V.

In addition, an ion implantation for forming a P-type well region (not shown), an ion implantation for forming a buried layer (not shown) for blocking punch-through of a MISFET, and an ion implantation for adjusting a threshold voltage ($V_{th}$) are suitably performed for a region in which an N-channel MISFET is intended to be formed. As a result, an NMOS channel region is formed. In addition, an ion implantation for forming an N-type well region (not shown), an ion implantation for forming a buried layer (not shown) for blocking punch-through of a MISFET, and an ion implantation for adjusting a threshold voltage (Vth) are suitably performed for a region in which a P-channel MISFET is intended to be formed. As a result, a PMOS channel region is formed. It is noted that channel regions may be formed in the region MV/HV in which the middle-voltage transistor and the high-voltage transistor are intended to be formed, and the region LVN-1, the region LVN-2, and the region LVP in which the respective low-voltage transistors are intended to be formed.

A gate insulating film 13 is formed on a surface of the region MV/HV in the semiconductor substrate 11. The high-voltage transistor and the middle-voltage transistor have thick gate insulating films, respectively, in many cases. The gate insulating film 13, for example, is formed from a silicon oxide film, and is also formed to have a thickness of 2 to 4 nm. A first gate electrode 15 is formed on the gate insulating film 13. The first gate electrode 15, for example, is made of polysilicon or amorphous silicon, and has a thickness of 100 to 150 nm.

An insulating film 61 identical to the gate insulating film 13 is formed on the surface of the region MR of the semiconductor substrate 11. A resistor main body 62 is formed on the insulating film 61. The resistor main body 62, for example, is made of polysilicon or amorphous silicon and is also formed to have a thickness of 100 to 150 nm. Moreover, a resistor protecting layer 63 is formed on the resistor main body 62. Thus, the resistor protecting layer 63, for example, is formed from a silicon oxide layer. Or, the resistor protecting layer 63 is formed from either a silicon nitride layer or a silicon oxynitride layer. For example, when the resistor protecting layer 63 is formed from the silicon oxide layer, oxygen ions are implanted into an upper layer of the resistor main body 62 by performing a cluster ion implantation, thereby making it possible to form a silicon oxide layer. Selection of nitrogen as ion species to be implanted results in that the silicon nitride layer is allowed to be formed. On the other hand, selection of oxygen and nitrogen as ion species to be implanted results in the silicon oxynitride layer being allowed to be formed. In addition, the resistor protecting layer 63 may be formed from an impurity layer. When the resistor protecting layer 63 is formed from the impurity layer, an impurity of an opposite conductivity type is implanted into a region so as to cancel one conductivity type of an impurity implanted into the resistor main body 62. As a result, the region becomes a region, having a high resistance value, which is formed from an insulating layer or is close thereto.

As has been described, a step is prevented from being formed in an end portion of the resistor protecting layer 63 because the resistor protecting layer 63 is formed by performing the ion implantation. Therefore, even when the chemical mechanical polishing (CMP) is performed for the conductive film or the like in the later process, a residue of the conductive film or the like is prevented from being left in the end portion of the resistor protecting layer 63.

Dummy gate insulating films and dummy gate electrodes (not shown) are temporarily formed on the region LVN-1, the LVN-2, and the region LVP in the semiconductor substrate 11, respectively. Also, offset spacers 19 are formed on each of sidewalls of the dummy gate electrodes, and each of the sidewalls of the first gate electrodes 15, respectively. A thickness of each of the offset spacers 19, for example, is in the range of 6 to 10 nm. Offset spacers (not shown) are formed on the sidewalls as well of the resistor main body 62 in terms of manufacturing.

Also, extension regions 21 and 22 are formed on a surface side of the semiconductor substrate 11 and below both sides of the first gate electrode 15. It is noted that the same extension regions 21 and 22 are also formed on the surface side of the semiconductor substrate 11 and below both sides of the resistor main body 62 in terms of manufacturing. In addition, extension regions 23 and 24 of the N-channel MISFET are formed on the surface side of the semiconductor substrate 11 and below both sides of each of the dummy gate electrodes of the region LVN-1 and the region LVN-2, respectively. Moreover, extension regions 25 and 26 of the P-channel MISFET are formed on the surface side of the semiconductor substrate 11 and below both sides of the dummy gate electrodes of the region LVP, respectively.

Moreover, sidewalls 20 are formed on side portions of each of the first gate electrodes 15, and each of the dummy gate electrodes through the offset spacers 19, respectively. The sidewalls 20 are formed on side portions as well of the resistor main body 62 through the offset spacers (not shown) described above, respectively, in terms of manufacturing.

Also, source/drain regions 27 and 28 are formed on the surface side of the semiconductor substrate 11 and below the both sides of the first gate electrode 15 through the corresponding ones of the extension regions 21 and 22, respectively. The source/drain regions 27 and 28 are formed on the surface side of the semiconductor substrate 11 and below the both sides of the resistor main body 62 through the corresponding ones of the extension regions 21 and 22, respectively, in terms of manufacturing. In addition, source/drain regions 29 and 30 are formed on the surface side of the semiconductor substrate 11 and below the both sides of each of the dummy gate electrodes of the region LVN-1 and the region LVN-2 through the corresponding ones of the extension regions 23 and 24 of the N-channel MISFETs, respectively. Also, source/drain regions 31 and 32 are formed on the surface side of the semiconductor substrate 11 and below the both sides of the dummy gate electrode of the region LVP through the extension regions 25 and 26 of the P-channel MISFET, respectively.

A silicide layer 33 is formed on each of the source/drain regions 27 to 32. The silicide layer 33, for example is made of cobalt silicide ($CoSi_2$), nickel silicide ($NiSi_2$), nickel platinum silicide, or the like.

Also, a liner film 36 is formed over the entire surface of the semiconductor substrate 11 so as to partially cover the first gate electrode 15, the resistor main body 62 (including a resistor protecting layer 63), the dummy gate electrodes and the like. Also, a first interlayer insulating film 38 is formed over an upper surface of the liner film 36.

The liner film 36, for example, is formed from a silicon nitride (SiN) film, and serves to apply a stress to corresponding one of channel portions of the transistors. For example, the liner film having a tensile stress is used in the N-channel MISFET for the purpose of increasing a mobility in a channel. Also, the liner film having a compressive stress is used in the P-channel MISFET for the purpose of increasing a mobility in a channel. In addition, the liner films may be individually formed for the N-channel MISFET and the P-channel MISFET, respectively. Also, the stress applied by the liner film 36 can be normally determined depending on the film deposition conditions.

The first interlayer insulating film 38, for example, is formed from a silicon oxide ($SiO_2$) film formed by utilizing the high density plasma (HDP) CVD method. Also, surfaces of the first interlayer insulating film 38 and the liner film 36 are planarized so as to expose each of upper surfaces of the first gate electrodes 15, and the dummy gate electrodes (not shown).

Trenches 42 for gate formation are formed so as to extend completely through the first interlayer insulating film 38 and the liner film 36 in the second region 11B by removing the dummy gate electrodes and the dummy gate insulating film.

A second gate insulating film 43 is formed on each of inner surfaces of the trenches 42 for gate formation. The second gate insulating film 43 is formed so that a capacity per unit area obtained based on the second gate insulating film 43 is larger than that obtained based on the first gate insulating film 13 in the first region 11A. The second gate insulating film 43 is formed from a high-permittivity film. The high-permittivity film, for example, is made of oxide, oxysilicate or oxynitride of hafnium, zirconium, lanthanum, yttrium, tantalum or aluminum. Specifically, the high-permittivity film, for example, is made of hafnium oxide ($HfO_2$), zirconium oxide ($ZrO_2$), lanthanum oxide ($LaO_3$), yttrium oxide ($Y_2O_3$), tantalum oxide ($Ta_2O_5$), aluminum oxide ($Al_2O_3$), hafnium silicate ($HfSiO_x$), zirconium silicate ($ZrSiO_x$), lanthanum silicate ($LaSiO_x$), yttrium silicate ($YSiO_x$), tantalum silicate ($TaSiO_x$), aluminum silicate ($AlSiO_x$), zirconium titanate ($ZrTiO_x$), hafnium aluminum oxide ($HaAlO_x$), or hafnium zirconium oxide ($HfZrO_x$). Or, the high-permittivity film is made of nitride of any of these compounds. A relative permittivity of the high-permittivity film fluctuates depending on a composition, a state (crystalline or amorphous), and the like. However, in general, the relative permittivity of the hafnium oxide ($HfO_2$) is in the range of 25 to 30, and the relative permittivity of the zirconium oxide ($ZrO_2$) is in the range of 20 to 25.

In addition, work function controlling films 44 and 45 for determining work functions are formed on the inner surfaces of the trenches 42 for gate formation through the second gate insulating films 43, respectively. Normally, the work function controlling film has the work function of 4.6 eV or less, preferably, 4.3 eV or less in the gate electrode of the N-channel MISFET. On the other hand, the work function controlling film has the work function of 4.6 eV or more, preferably, 4.9 eV or more in the gate electrode of the P-channel MISFET. Also, a difference between these work functions is preferably equal to or larger than 0.3 eV. Specifically, although depending on the composition, the state (crystalline or amorphous) and the like, the work function of hafnium silicide ($HfSi_x$) for the N-channel MISFET is in the range of about 4.1 to about 4.3 eV, and the work function of titanium nitride (TiN) for the P-channel MISFET is in the range of about 4.5 to about 5.0 eV. As an example of the material for each of the work function controlling films 44 and 45 described above, there is a metal such as titanium (Ti), vanadium (V), nickel (Ni), zirconium (Zr), niobium (Nb), molybdenum (Mo), ruthenium (Ru), hafnium (Hf), tantalum (Ta), tungsten (W) or platinum (Pt), an alloy thereof, or a compound thereof. As the metallic compound, there is a metallic nitride, or a compound of a metal and a semiconductor. Also, with regard to the compound of a metal and a semiconductor, as an example, there is a metallic silicide.

The work function controlling film 44 made of a metal or a metallic compound having the work function suitable for the N-channel MISFET is formed in each of the trenches 42 for gate formation in the region LVN-1, and the region LVN-2. For the material for the work function controlling film 44, as an example, there is a metal such as hafnium (Hf) or tantalum (Ta), an alloy thereof, or a compound thereof. Specifically, a hafnium silicide ($HfSi_x$) is more preferable as the material for the work function controlling film 44.

In addition, the work function controlling film 45 made of a metal or a metallic compound having the work function suitable for the P-channel MISFET is formed in the trench 42 for gate formation in the region LVP. For the material for the work function controlling film 45, as an example, there is a metal such as titanium (Ti), molybdenum (Mo) or ruthenium (Ru), an alloy thereof, or a compound thereof. Specifically, a titanium nitride (TiN) or ruthenium (Ru) is more preferable as the material for the work function controlling film 45.

Moreover, a conductive film 46 is formed as a conductive material so as to be filled in each of the insides of the trenches 42 for gate formation. A metallic material having an electrical resistance value lower than that of each of the work function controlling films 44 and 45, for example, is used for the conductive film 46. In this embodiment, tungsten (W) is used as an example of the metallic material for the conductive film 46.

As has been described above, the second gate electrode 47 of each of the low-voltage transistors (N-channel MISFETs) in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) of the region LVP in the second region 11B is formed from the conductive film 46 and the work function controlling film 45 which are left in corresponding one of the trenches 42 for gate formation.

A protective film 49 for protecting the second gate electrode 47 and the second gate electrode 48 is formed over the first interlayer insulating film 38 and the liner film 36 in the second region 11B. The protective film 49 is formed from either silicon oxide ($SiO_2$) or silicon nitride (SiN) film by, for example, utilizing a plasma CVD method. A film deposition temperature at that time is set at 450° C. or less. As a result, the thermal damage is prevented from being incurred on the silicide layer 33 previously formed.

A silicide layer 40 is formed on an upper surface of the first gate electrode 15. The silicide layer 40, for example, is made of cobalt silicide ($CoSi_2$), nickel silicide ($NiSi_2$), nickel platinum silicide or the like.

A second interlayer insulating film 51 is formed over all the surfaces of the liner film 36, the first interlayer insulating film 38, the silicide layer 40, the protective film 49, and the like. The second interlayer insulating film 51, for example, is formed from a silicon oxide ($SiO_2$) film.

Connection holes 52 to the first gate electrode 15, the second gate electrodes 47 and 48, and the source/drain regions 27 to 32 of the transistors are formed so as to extend completely through the liner film 36, the first interlayer insulating film 38, the protective film 41, and the second interlayer insulating film 51. Also, electrodes 54 each being formed from a conductive film are formed so as to be filled in the connection holes 52, respectively.

As has been described, the middle-voltage transistor (N-channel MISFET)/high-voltage transistor (N-channel MISFET) is formed in the region MV/HV of the first region 11A. The resistor 3 is formed in the region MR of the first region 11A. Also, the low-voltage transistors (N-channel MISFETs) 4 are densely formed in the region LVN-1 of the second region 11B, the low-voltage transistor (N-channel MISFET) 4 is formed in isolation in the region LVN-2 thereof, and the low-voltage transistor (P-channel MISFET) 5 is formed in the region LVP thereof. In such a manner, the semiconductor device 1 is formed.

In the semiconductor device 1, described above, according to the first embodiment of the present invention, the middle-voltage transistor (N-channel MISFET)/high-voltage transistor (N-channel MISFET) 2 is formed as a first group of transistors in the region MV/HV on the semiconductor substrate 11. In addition, the low-voltage transistor (N-channel MISFET) 4, and the low-voltage transistor (P-channel MISFET) 5 are formed as a second group of transistors each having the lower operating voltage than that of each of the transistors in the first group are formed in the region LVN-1, the region LVN-2, and the region LVP, respectively, on the semiconductor substrate 11.

Moreover, a resistor 3 is formed in the region MR of the first region 11A. In the resistor 3, the resistor protecting layer 63 is formed on the resistor main body 62. Thus, in the case where the transistors in the second group are formed such that the metal based gate materials are filled in the trenches for gate formation, respectively, the resistor main body 62 is prevented from being trimmed because the resistor protecting layer 63 serves as a polishing stopper when the extra portions of the metal system gate materials of which the metal system gates are made, respectively, are removed by performing the polishing or the like. For this reason, the resistance value of the resistor main body 62 is prevented from fluctuating. Therefore, the resistance value of the resistor main body 62 can be formed to have desired one. In addition, a height of the resistor main body 62 can be adjusted based on the formation of the resistor protecting layer 63. In addition, the resistor protecting layer 63 can be formed by, for example, performing the cluster ion implantation using oxygen. Thus, suitably setting the ion implantation conditions makes it possible to control an ion implantation depth to the resistor main body 62. Thus, the resistance value of the resistor main body can be controlled to have desired one. Therefore, a thickness of the resistor main body 62 can be set to desired one, and also the resistor main body 62 is protected by the resistor protecting layer 63. As a result, it is possible to suppress the dispersion in the resistance value.

Moreover, there is formed the protective film 49 for covering the second gate electrodes 47 and 48 in the second group of transistors. Thus, the silicide layer 40 is formed on the first gate electrode 15 of the first group of transistors after completion of the formation of the protective film 49, which results in that the second gate electrodes 47 and 48 of the second group of transistors can be protected when the silicide layer 40 is formed. That is to say, it is prevented that the second gate electrodes 47 and 48 are etched to be removed when the metallic film formed due to the unreacted silicidization is removed. In such a manner, the electrical resistance value of the first gate electrode 15 is reduced because of the formation of the silicide layer 40 on the first gate electrode 15.

Therefore, there is an advantage that the first group of transistors (the group of high-withstand voltage (high-voltage operating and middle-voltage operating) transistors having the gate insulating film 13 made of either silicon oxide or silicon oxynitride, and the first gate electrode 15 made of either polysilicon or amorphous silicon, the second group of transistors (for example, the group of low-voltage operating transistors) having the gate insulating films 43 each having the high-permittivity (High-k) film, and the second gate electrodes 47 and 48 as the so-called metal gate electrodes, and the resistor 3 are formed on the same semiconductor substrate 11, so that it is possible to provide the resistor 3 having the resistance value having the suppressed dispersion.

A method of manufacturing the semiconductor device according to a first embodiment of the present invention will be described in detail hereinafter with reference to cross sectional views, showing manufacturing processes, of FIGS. 2A to 2C.

As shown in FIG. 2A, the device isolation regions 12 are formed in the semiconductor substrate 11 by performing the device isolation process. The device isolation regions 12 are formed for the purpose of isolating the region LVN and the region LVP in which the low-voltage transistors (for example, the MISFETs) are intended to be formed, respectively, the region MV/HV in which the middle-voltage transistor (for example, the MISFET) and the high-voltage transistor (for example, the MISFET) are intended to be formed, and the region MR in which the resistor is intended to be formed from one another. The region MV/HV includes not only the region in which the pattern density of the MISFET is dense, but also the region having the isolated pattern. Also, the region MV/HV, and the region MR are given the generic name of the first region 11A. Also, the region LVN, and the region LVP are given the generic name of the second region 11B. The regions which are isolated from one another by the device isolation regions 12 become the active regions, respectively.

Next, an ion implantation for forming a P-type well region (not shown), an ion implantation for forming a buried layer (not shown) for blocking punch-through of the MISFET, and an implantation for adjusting a threshold voltage ($V_{th}$) are suitably performed for a region in which the N-channel MISFET is intended to be formed. As a result, an NMOS channel region is formed. In addition, an ion implantation for forming an N-type well region (not shown), an ion implantation for forming a buried layer (not shown) for blocking punch-through of the MISFET, and an ion implantation for adjusting a threshold voltage ($V_{th}$) are suitably performed for a region in which the P-channel MISFET is intended to be formed. As a result, a PMOS channel region is formed. At this time, the ion implantations may be carried out for the region MV/HV in which the middle-voltage transistor and the high-voltage transistor are intended to be formed, and the region LVN-1, the region LVN-2, and the region LVP in which the respective low-voltage transistors are intended to be formed under the respective ion implantation conditions.

Next, the gate insulating film 13 is formed on a surface of the region MV/HV in the semiconductor substrate 11. The high-voltage transistor and the middle-voltage transistor have the thick gate insulating films, respectively, in many cases. Thus, the gate insulating film 13, for example, is formed from a silicon oxide film. This silicon oxide film, for example, is formed at 750 to 900° C. by utilizing a thermal oxidation method, and has a thickness of 2 to 4 nm. Although the gate insulating films 13 are formed in the region MR of the first region 11A and in the active regions as well of the second region 11B, respectively, concurrently with formation of the gate insulating film 13 in the region MV/HV of the first region 11A, they are used as the insulating film 61 in the region MR, and used as dummy gate insulating films 14 in the second region 11B, respectively.

Next, a silicon based material layer 71 for formation of the first gate electrode 15, the resistor main body 62, and the dummy gate electrodes is formed over the gate insulating film 13, the insulating film 61, and the dummy gate insulating films 14. The silicon based material layer 71 is formed by, for example, depositing a polysilicon or amorphous silicon layer over the entire surface of the semiconductor substrate 11 through the gate insulating film 13, the insulating film 61, and the dummy gate insulating films 14. For example, when the silicon based material layer 71 is made of polysilicon, a polysilicon layer, for example, is deposited to have a thickness of 100 to 150 nm, for example, 150 nm at a film deposition temperature of 580 to 620° C. by, for example, using monosilane ($SiH_4$) gas as raw material gas by utilizing the LP-CVD method.

Next, an ion implantation process for reducing the gate resistance value is carried out. A resist film (not shown) is formed on the silicon based material layer 71 by utilizing the resist application technique and the lithography technique. Also, an opening portion is formed in a portion of the resist film corresponding to the region MV/HV of the first region 11A. Subsequently, an ion implantation is performed for the silicon based material layer 71 in the region MV/HV in order to reduce the gate resistance of a portion of the silicon based material layer 71 in the region MV/HV. As an example, in the case of the P-channel MISFET, boron (B) ions are implanted at an implantation energy of 5 keV with a dose of $8\times10^{15}/cm^2$, whereas in the case of the N-channel MISFET, phosphorus (P) ions are implanted at an implantation energy of 10 keV with a dose of $8\times10^{15}/cm^2$. The ion implantation conditions are merely an example, and thus the conditions can be suitably selected. After that, the resist film described above is removed away by, for example, performing ashing and by using a mixed liquid of sulfuric acid and hydrogen peroxide.

Next, by utilizing the same technique, that is, by utilizing the resist application technique and the lithography technique, a resist film (not shown) is formed on the silicon based material layer 71. Also, an opening portion is formed in a portion of the resist film corresponding to the region MR of the first region 11A. Subsequently, an ion implantation is performed for the silicon based material layer 71 in the region MR in order to determine the resistance value of a portion of the silicon based material layer 71 in the region MR. As an example, boron (B) ions are implanted at an implantation energy of 15 keV with a dose of $3\times10^{15}/cm^2$. The ion implantation conditions are merely an example, and thus the conditions can be suitably selected. After that, the resist film described above is removed away by, for example, performing the ashing and by using the mixed liquid of sulfuric acid and hydrogen peroxide.

Next, as shown in FIG. 2B, a resist film (not shown) is formed on the silicon based material layer 71 by utilizing the resist application technique and the lithography technique. Also, an opening is formed in a region of the silicon based material layer 71, in the region MR of the first region 11A, other than a region in which contacts are intended to be formed. Also, a cluster ion implantation using either carbon dioxide ($CO_2$) or oxygen ($O_2$) is performed through the opening, thereby forming an oxide layer in an upper portion of the silicon based material layer 71 in the region MR. The resulting oxide layer becomes the resistor protecting layer 63. In the cluster ion implantation, in addition to the oxygen ions, nitrogen ions are implanted through the opening, thereby forming an oxynitride layer, whereas nitrogen ions are implanted through the opening instead of implanting the oxygen ions, thereby forming a nitride layer. In this case, the resulting oxynitride layer or nitride layer may also be made the resistor protecting layer 63. A thickness of the resistor protecting layer 63, as an example, is 30 nm. After that, as an example, the resist film is removed away by performing the ashing and by using the mixed liquid of sulfuric acid and hydrogen peroxide.

Figure 2C:
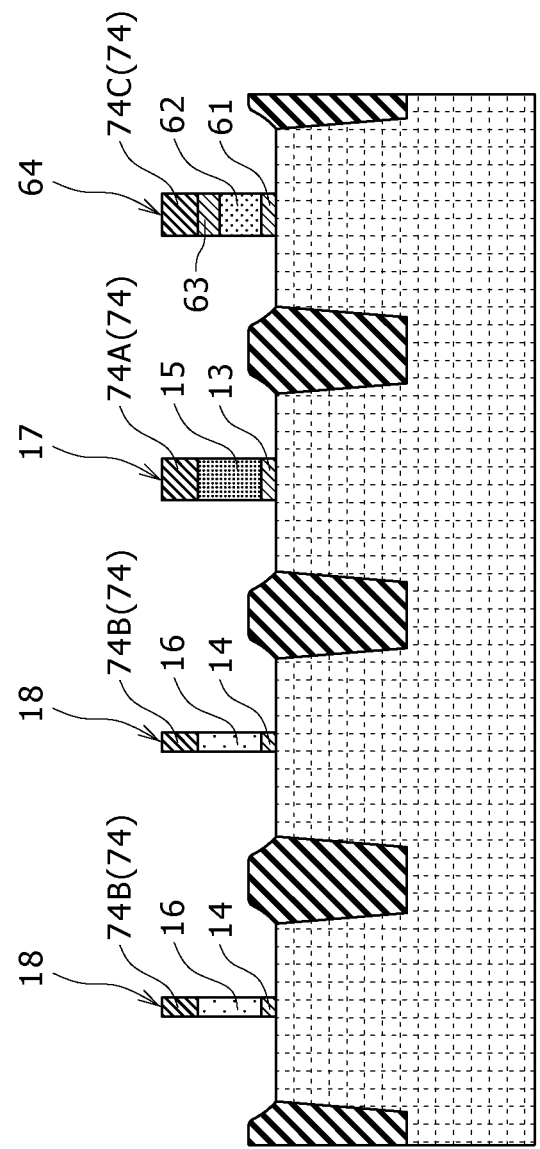

Next, as shown in FIG. 2C, a hard mask layer 74 is formed on the silicon based material layer 71 (refer to FIG. 2B). In this case, a silicon nitride (SiN) film is deposited to have a thickness of, for example, about 50 to about 100 nm by, for example, utilizing the LP-CVD method, thereby forming the hard mask layer 74. In this case, the silicon nitride film is formed to have the thickness of 80 nm.

Next, a resist pattern (not shown) for formation of the first gate electrode 15 and the dummy gate electrodes 16 is formed on the hard mask layer 74 by utilizing the resist application technique and the lithography technique. After that, the hard mask layer 74 is processed with the resist pattern as an etching mask by, for example, utilizing an anisotropic etching method, thereby forming a hard mask 74A, hard masks 74B, and a hard mask 74C. Here, the hard mask 74A is used to form the first gate electrode 15 of the middle-voltage transistor/high-voltage transistor in the first region 11A. The hard masks 74B are used to form the second gate electrodes of the low-voltage transistors in the second region 11B, respectively. Also, the hard mask 74C is used to form the resistor 3 in the first region 11A. For the anisotropic etching method, for example, hydrogen bromide (HBr) or chlorine (Cl) system gas is used as etching gas. Moreover, the resistor main body 62 and the dummy gate electrodes 16 are formed in the first region 11A and the second region 11B, respectively, by using each of the hard masks 74B and 74C as an etching mask at the same time that the first gate electrode 15 is formed in the first region 11A by using the hard mask 74A as an etching mask. At this time, the resistor protecting layer 63, the gate insulating film 13, the dummy gate insulating films 14, and the insulating film 61 are also partially etched.

In such a manner, a gate portion 17 is composed of the hard mask 74A, the first gate electrode 15, and the gate insulating film 13. Each of the dummy gate portions 18 is composed of the hard mask 74B, the dummy gate electrode 16 and the dummy gate insulating film 14. Also, a resistor portion 64 is composed of the hard mask 74C, the resistor protecting layer 63, the resistor main body 62 and the insulating film 61.

Figure 3B:
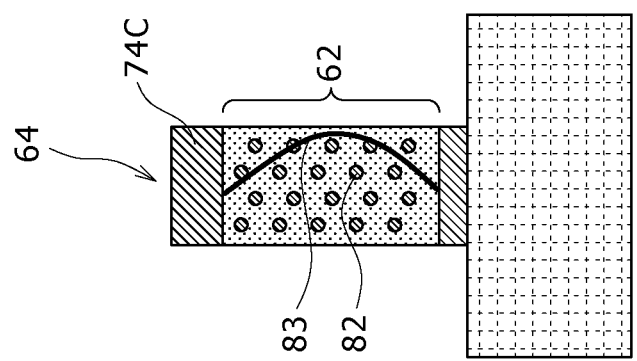
FIGS. 3A and 3B are respectively schematic cross sectional views of a main portion explaining the comparison of the first embodiment of the present invention with the related art.
Figure 3A:
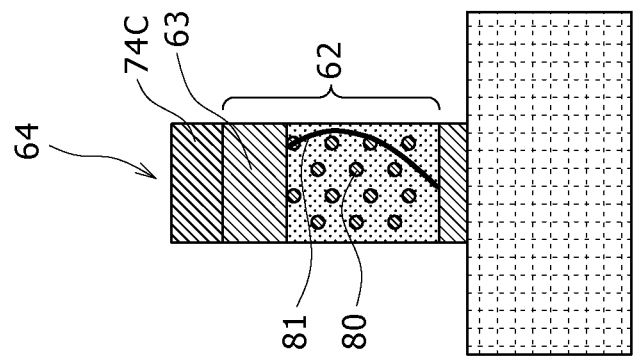

As shown in FIG. 3A, in the resistor portion 64, the resistor protecting layer 63 formed from the insulating layer (the oxide layer, the oxynitride layer or the nitride layer in this case) formed by performing the cluster ion implantation is formed in the upper portion of the resistor main body 62. The resistor protecting layer 63 formed from the insulating layer is formed in the upper portion of the resistor main body 62 in such a way. Thus, in the case where the transistors in the second group are formed to have the metal system gates, when the hard mask 74C is removed in order to form the trenches for gate formation or when the extra portions of the metal system materials of which the metal system gates are made, respectively, are removed away by performing the polishing or the like, the resistor protecting layer 63 serves as the polishing stopper even when the hard mask 74C is removed. As a result, the resistor main portion 62 is prevented from being trimmed. For this reason, the resistance value of the resistor main portion 62 is prevented from fluctuating. In addition, the height of the resistor main portion 62 can be adjusted based on the formation of the resistor protecting layer 63. The resistor protecting layer 63 is formed by performing the cluster ion implantation. Thus, the ion implantation depth to the resistor main body 62 can be controlled by suitably setting the ion implantation conditions. Therefore, the dispersion in the resistance value can be suppressed because the thickness of the resistor main body 62 can be set to desired one. Note that, in FIG. 3A, reference numeral 80 schematically represents the impurity in the resistor main body 62, and reference numeral 81 represents a distribution of an impurity concentration in the resistor main body 62.

On the other hand, in the case of the related art, as shown in FIG. 3B, only the hard mask 74C is formed in the upper portion of the resistor main body 62. When the transistors in the second group are formed to have the metal gates, the upper portion of the resistor main body 62 is trimmed when the extra portions of the metallic materials of which the metal gates are made, respectively, are removed by performing the polishing or the like because the hard mask 74C is removed. As a result, the resistance value disperses. Here, in FIG. 3B, reference numeral 82 schematically represents the impurity in the resistor main body 62, and reference numeral 83 represents a distribution of an impurity concentration in the resistor main body 62.

Figure 4A:
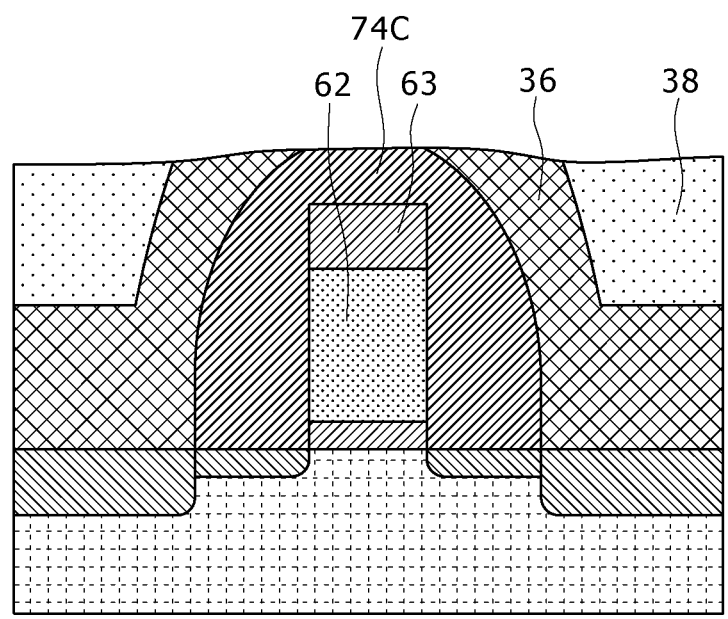
FIGS. 4A and 4B are respectively schematic cross sectional views of a main portion explaining the effects of the first embodiment of the present invention.
Figure 4B:
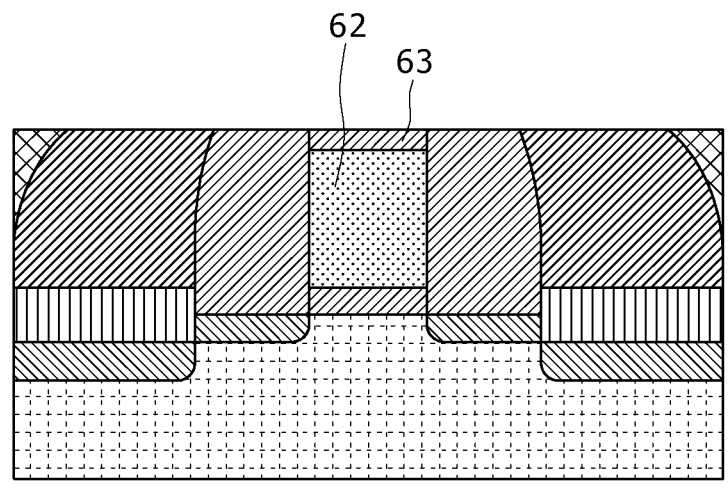

In addition, as shown in FIG. 4A, when in the state in which the resistor protecting layer 63 is formed on the resistor main body 62 and the hard mask 74C is formed on the resistor protecting layer 63, the liner film 36 and the first interlayer insulating film 38 are planarized by utilizing the CMP method to expose the hard mask 74C, and the hard mask 74C is then removed by utilizing the CMP method, as shown in FIG. 4B, the resistor main body 62 is prevented from being trimmed because the resistor protecting layer 63 serves as the polishing stopper. Moreover, as described above, when the extra portions of the metallic materials of which the metallic gates are made, respectively, are removed away by performing the polishing or the like, the resistor main body 62 is prevented from being trimmed because the resistor protecting layer 63 serves as the polishing stopper.

Accordingly, the formation of the resistor protecting layer 63 as in this embodiment of the present invention makes it possible to set the thickness of the resistor main body 62 to desired one. As a result, the dispersion in the resistance value can be suppressed, and thus the resistor having the highly precise resistance value can be formed together with the transistors.

A method of manufacturing a semiconductor device according to a second embodiment of the present invention will be described in detail hereinafter with reference to cross sectional views, showing manufacturing processes, of FIGS. 5A and 5B.

As shown in FIG. 5A, the device isolation regions 12 are formed in the semiconductor substrate 11 by performing the device isolation process. The device isolation regions 12 are formed for the purpose of isolating the region LVN and the region LVP in which the low-voltage transistors (for example, the MISFETs) are intended to be formed, respectively, the region MV/HV in which the middle-voltage transistor (for example, the MISFET) and the high-voltage transistor (for example, the MISFET) are formed, and the region MR in which the resistor is intended to be formed from one another. The region MV/HV includes not only the region in which the pattern density of the MISFET is dense, but also the region having the isolated pattern. Also, the region MV/HV and the region MR are given the generic name of the first region 11A. Also, the region LVN and the region LVP are given the generic name of the second region 11B. The regions which are isolated from one another by the device isolation regions 12 become the active regions, respectively.

Next, an ion implantation for forming a P-type well region (not shown), an ion implantation for forming a buried layer (not shown) for blocking punch-through of the MISFET, and an implantation for adjusting a threshold voltage ($V_{th}$) are suitably performed for a region in which the N-channel MISFET is intended to be formed. As a result, the NMOS channel region is formed. In addition, an ion implantation for forming an N-type well region (not shown), an ion implantation for forming a buried layer (not shown) for blocking punch-through of the MISFET, and an ion implantation for adjusting a threshold voltage ($V_{th}$) are suitably performed for a region in which the P-channel MISFET is intended to be formed. As a result, the PMOS channel region is formed. At this time, the ion implantations may be carried out for the region MV/HV in which the middle-voltage transistor and the high-voltage transistor are intended to be formed, and the region LVN and the region LVP in which the low-voltage transistors are intended to be formed, respectively, under the respective ion implantation conditions.

Next, the gate insulating film 13 is formed on the surface of the region MV/HV in the semiconductor substrate 11. The high-voltage transistor and the middle-voltage transistor have the thick gate insulating films, respectively, in many cases. Thus, the gate insulating film 13, for example, is formed from a silicon oxide film. This silicon oxide film, for example, is formed at 750 to 900° C. by utilizing the thermal oxidation method, and has a thickness of 2 to 4 nm. Although the gate insulating films 13 are also formed in the region MR in the first region 11A and in the active regions of the second region 11B, respectively, concurrently with the formation of the gate insulating film 13 in the first region 11A, they are used as the insulating film 61 in the region MR of the first region 11A and are used as the dummy gate insulating films 14 of the regions LVN and LVP in the second region 11B.

Next, a silicon based material layer 71 for formation of the first gate electrode 15, the resistor main body 62, and the dummy gate electrodes is formed over the gate insulating film 13, the insulating film 61, and the dummy gate insulating films 14. The silicon based material layer 71 is formed by, for example, depositing a polysilicon or amorphous silicon layer over the entire surface of the semiconductor substrate 11 through the gate insulating film 13, the insulating film 61, and the dummy gate insulating films 14 on the semiconductor substrate 11. For example, when the silicon based material 71 is made of polysilicon, the polysilicon layer is deposited to have the thickness of 100 to 150 nm, for example, 150 nm at the film deposition temperature of 580 to 620° C. by, for example, using monosilane ($SiH_4$) gas as the raw material gas by utilizing the LP-CVD method.

Next, the ion implantation process for reducing the gate resistance value is carried out. The resist film (not shown) is formed on the silicon based material layer 71 by utilizing the resist application technique and the lithography technique. Also, the opening portion is formed in the portion of the resist film corresponding to the region MV/HV of the first region 11A. Subsequently, the ion implantation is performed for the silicon based material layer 71 in the region MV/HV of the first region 11A in order to reduce the gate resistance of the portion of the silicon based material layer 71 in the region MV/HV. As an example, in the case of the P-channel MISFET, boron (B) ions are implanted at an implantation energy of 5 keV with a dose of $8 \times 10^{15}/cm^2$, whereas in the case of the N-channel MISFET, phosphorus (P) ions are implanted at an implantation energy of 10 keV with a dose of $8 \times 10^{15}/cm^2$. The ion implantation conditions are merely an example, and thus the condition can be suitably selected. After that, the resist film described above is removed by, for example, performing the ashing and by using the mixed liquid of sulfuric acid and hydrogen peroxide.

Next, by utilizing the same technique, that is, by utilizing the resist application technique and the lithography technique, the resist film (not shown) is formed on the silicon based material layer 71. Also, the opening portion is formed in a portion of the resist film corresponding to the region MR of the first region 11A. Subsequently, the ion implantation is performed for the silicon based material layer 71 in the region MR in order to determine the resistance value of the portion of the silicon based material layer 71 in the region MR. As an example, boron (B) ions are implanted at an implantation energy of 15 keV with a dose of $3\times10^{15}/cm^2$. The ion implantation conditions are merely an example, and thus the conditions can be suitably selected. After that, the resist film described above is removed away by, for example, performing the ashing and by using the mixed liquid of sulfuric acid and hydrogen peroxide.

Next, the resist film (not shown) is formed on the silicon based material layer 71 by utilizing the resist application technique and the lithography technique. Also, the opening is formed in the region of the silicon based material layer 71, in the region MR of the first region 11A, other than the region in which the contacts are intended to be formed. Also, the impurity ions of a conductivity type opposite to that of the impurity with which the resistor main body 62 is doped are implanted through the opening portion, thereby forming a compensation region in the upper portion of the silicon based material layer 71 in the region MR. This compensation region becomes the resistor protecting layer 63. In the ion implantation described above, as an example, arsenic (As) ions are implanted at an implantation energy of 1 keV with a dose of $1\times10^{15}/cm^2$. The thickness of the resistor protecting layer 63 is set as an example to 30 nm. Therefore, the resistor protecting layer 63 described above becomes the high resistance region. In this ion implantation, it is necessary to form the resistor protecting layer 63 in the upper portion of the resistor main portion 62 which will be patterned in the later process. Thus, the ion implantation must be performed at an extremely-low energy such as 1 keV. That is to say, the resistor protecting layer 63 is preferably formed in a region, having a thickness of, for example, about 30 nm, of the uppermost portion of the resistor main portion 62. After that, the resist film is removed away as an example by performing the ashing and by using the mixed liquid of sulfuric acid and hydrogen peroxide.

No step is formed in the end portion of the resistor protecting layer 63 because the resistor protecting layer 63 is formed by performing the ion implantation in such a manner. Therefore, even when the conductive film or the like is polished by utilizing the CMP method in the later process, a residue of the conductive film or the like is prevented from being generated in the end portion of the resistor protecting layer 62.

Figure 5B:
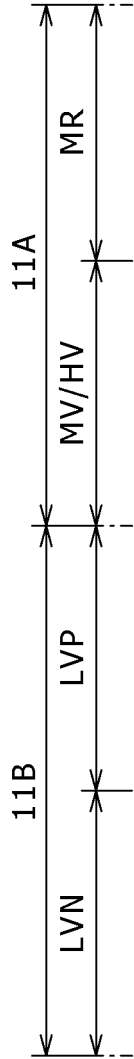
Figure 5B:
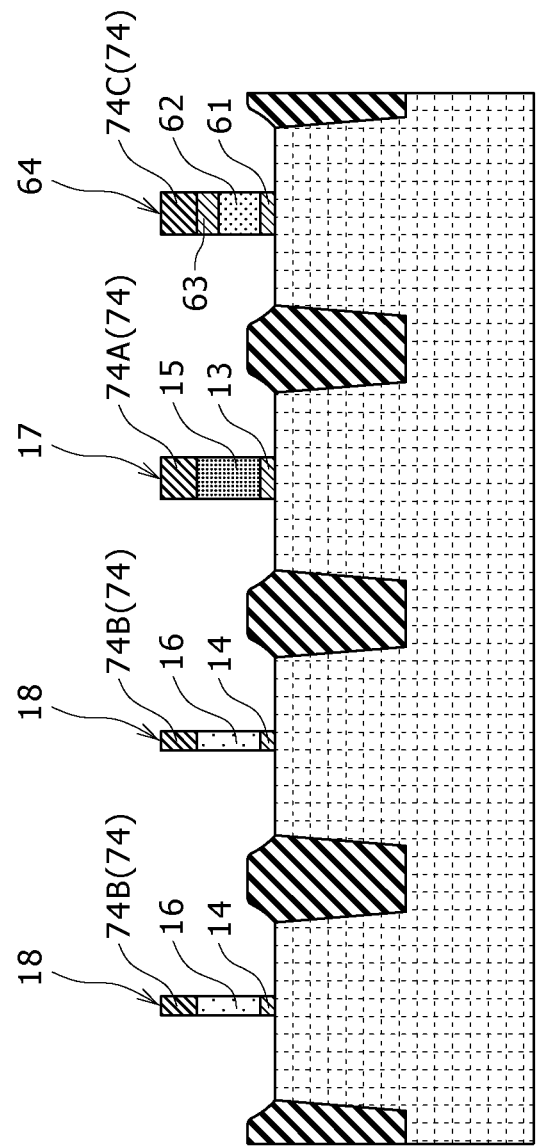

Next, as shown in FIG. 5B, the hard mask layer 74 is formed on the silicon based material layer 71 (refer to FIG. 5A). In this case, a silicon nitride (SiN) film is deposited to have a thickness of, for example, about 50 to about 100 nm by, for example, utilizing the LP-CVD method, thereby forming the hard mask layer 74. Here, the silicon nitride film is formed to have the thickness of 80 nm.

Next, the resist pattern (not shown) for formation of the first gate electrode 15 and the dummy gate electrodes 16 is formed on the hard mask layer 74 by utilizing the resist application technique and the lithography technique. After that, the hard mask layer 74 is processed with the resist pattern as the etching mask by, for example, utilizing the anisotropic etching method, thereby forming the hard mask 74A, the hard mask 74B, and the hard mask 74C. Here, the hard mask 74A is used to form the first gate electrode 15 of the middle-voltage transistor/high-voltage transistor of the region MV/HV in the first region 11A. The hard masks 74B are used to form the second gate electrodes of the low-voltage transistors of the regions LVN and LVP in the second region 11B, respectively. Also, the hard mask 74C is used to form the resistor 3 of the region MR in the first region 11A. For the anisotropic etching method, for example, the hydrogen bromide (HBr) or chlorine (Cl) system gas is used as the etching gas. Moreover, the resistor main body 62 and the dummy gate electrodes 16 are formed in the first region 11A and the second region 11B, respectively, by using each of the hard masks 74B and 74C as the etching mask at the same time that the first gate electrode 15 is formed in the first region 11A by using the hard mask 74A as the etching mask. At this time, the resistor protecting layer 63, the gate insulating film 13, the dummy gate insulating films 14, and the insulating film 61 are also partially etched.

In such a manner, the gate portion 17 is composed of the hard mask 74A, the first gate electrode 15, and the gate insulating film 13. Each of the dummy gate portions 18 is composed of the hard mask 74B, the dummy gate electrode 16 and the dummy gate insulating film 14. Also, the resistor portion 64 is composed of the hard mask 74C, the resistor protecting layer 63, the resistor main body 62 and the insulating film 61.

Figure 6A:
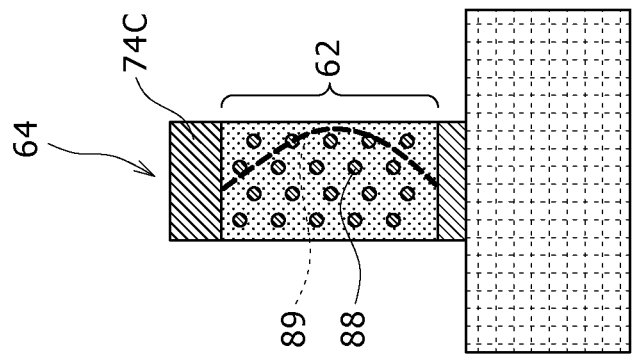
FIGS. 6A and 6B are respectively schematic cross sectional views of a main portion explaining the comparison of the second embodiment of the present invention with the related art.

As shown in FIG. 6A, in the resistor portion 64 described above, the resistor protecting layer 63 composed of the compensation region formed by performing the ion implantation is formed in the upper portion of the resistor main body 62. When the resistor main body 62, for example, is formed in the form of a P-type region, the upper portion of the resistor main body 62 is doped with an N-type impurity to obtain either an $N^-$-type region or a region a conductivity type of which is canceled therewith. The resistor protecting layer 63 composed of the compensation region as the $N^-$-type region or the region the conductivity type of which is canceled is formed in the upper portion of the resistor main body 62 in such a manner. Thus, in the case where the transistors in the second group are formed to have the metal system gates, when the hard mask 74C is removed in order to form the trenches 42 for gate formation, or when the extra portions of the metallic materials of which the metal gates are made, respectively, are removed by performing the polishing or the like, the lower portion of the resistor protecting layer 63 is left even when the upper portion of the resistor protecting layer 63 is trimmed away. As a result, the resistor main body 62 is prevented from being trimmed. For this reason, the resistance value of the resistor main portion 62 is prevented from fluctuating. In addition, the height of the resistor main portion 62 can be adjusted based on the formation of the resistor protecting layer 63. The resistor protecting layer 63 is formed by performing the ion implantation. Thus, the ion implantation depth to the resistor main body 62 can be controlled by suitably setting the ion implantation conditions. Therefore, the dispersion in the resistance value can be suppressed because the thickness of the resistor main body 62 can be set to desired one. Note that, in FIG. 6A, reference numeral 84 schematically represents the P-type impurity in the resistor main body 62, and reference numeral 85 schematically represents the N-type impurity in the resistor main body 62. Also, reference numeral 86 represents a distribution of the P-type impurity in the resistor main body 62, and reference numeral 87 represents a distribution of the N-type impurity in the resistor main body 62

Figure 6B:
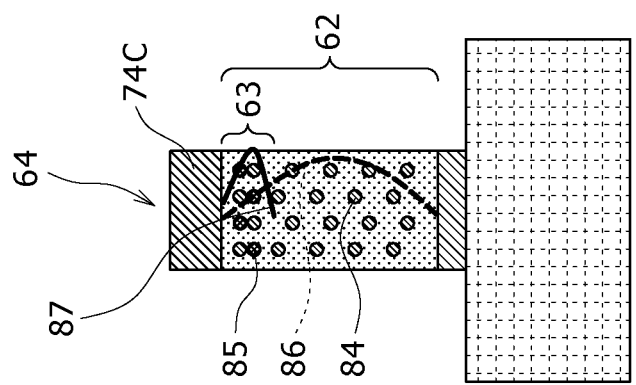

On the other hand, in the case of the related art, as shown in FIG. 6B, only the hard mask 74C is formed on the upper portion of the resistor main body 62. When the transistors in the second group are formed to have the metal gates, the upper portion of the resistor main body 62 is trimmed when the extra portions of the metallic materials of which the metal gates are made, respectively, are removed by performing the polishing or the like because the hard mask 74C is removed. As a result, the resistance value disperses. Here, in FIG. 6B, reference numeral 88 schematically represents the P-type impurity in the resistor main body 62, and reference numeral 89 represents a distribution of the P-type impurity concentration in the resistor main body 62.

Figure 7A:
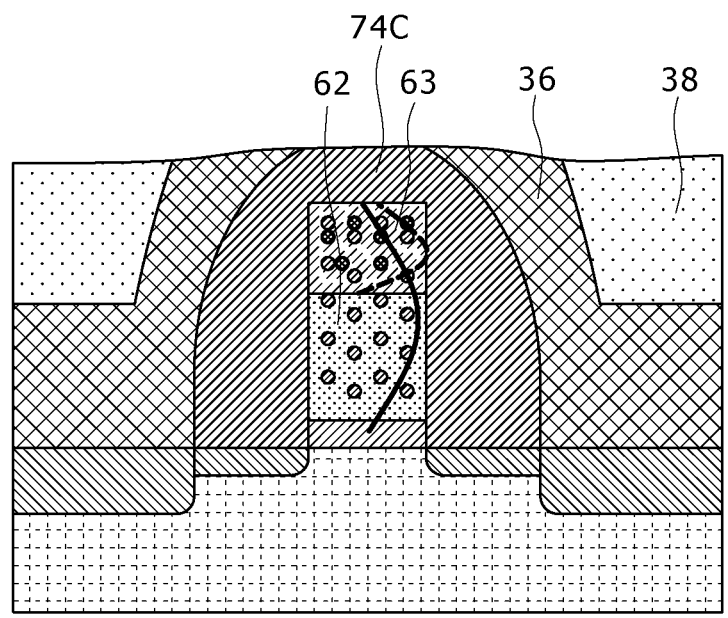
FIGS. 7A and 7B are respectively schematic cross sectional views of a main portion explaining the effects of the second embodiment of the present invention.
Figure 7B:
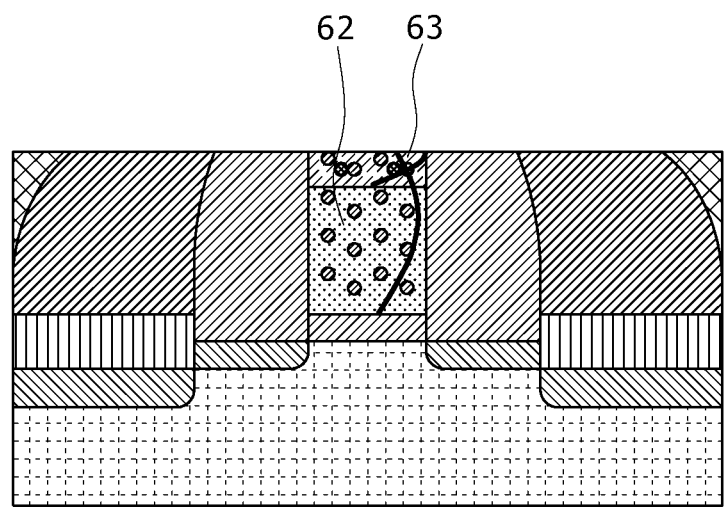

In addition, as shown in FIG. 7A, when in the state in which the resistor protecting layer 63 is formed on the resistor main body 62 and the hard mask 74C is formed on the resistor protecting layer 63, the liner film 36 and the first interlayer insulating film 38 are planarized by utilizing the CMP method to expose the hard mask 74C, and the hard mask 74C is then removed by utilizing the CMP method, as shown in FIG. 7B, the resistor main body 62 is prevented from being trimmed because the resistor protecting layer 63 is left on the resistor main body 62. Moreover, when the extra portions of the metallic materials of which the metallic gates are made, respectively, are removed by performing the polishing or the like, the resistor main body 62 is prevented from being trimmed because the resistor protecting layer 63 is left on the resistor main body 62.

Accordingly, the formation of the resistor protecting layer 63 as in this embodiment of the present invention makes it possible to set the thickness of the resistor main body 62 to desired one. As a result, the dispersion in the resistance value can be suppressed, and thus the resistor having the highly precise resistance value can be formed together with the transistors.

In the first embodiment and the second embodiment of the present invention, preferably, the dispersion in the thickness of the resistor protecting layer 63 falls within ±5 nm. When the dispersion therein is beyond this range, this exerts an influence on an increase in dispersion in the resistance value, and thus it becomes difficult to precisely determine the resistance value.

Although the silicon based material layer 71 from which each of the first gate electrode 15, the dummy gate electrodes 16, the resistor main body 62 and the like is formed is made of polysilicon, for example, it may also be made of amorphous silicon or polysilicon germanium. Either an N-type impurity or a P-type impurity is contained in the first gate electrode 15.

Next, an example of manufacturing processes after the gate portion, the dummy gate portions, and the resistor portion are formed in accordance with the first embodiment or the second embodiment of the present invention will be described in detail with reference to cross sectional views, showing manufacturing processes, of FIGS. 8A to 8N.

In this example, there is shown the case where the region LVN-1 in which the N-channel MISFETs as the low-voltage transistors are densely formed, and the region LVN-2 in which the N-channel MISFET as the low-voltage transistor is formed in isolation are formed in the region LVN described above.

Figure 8A:
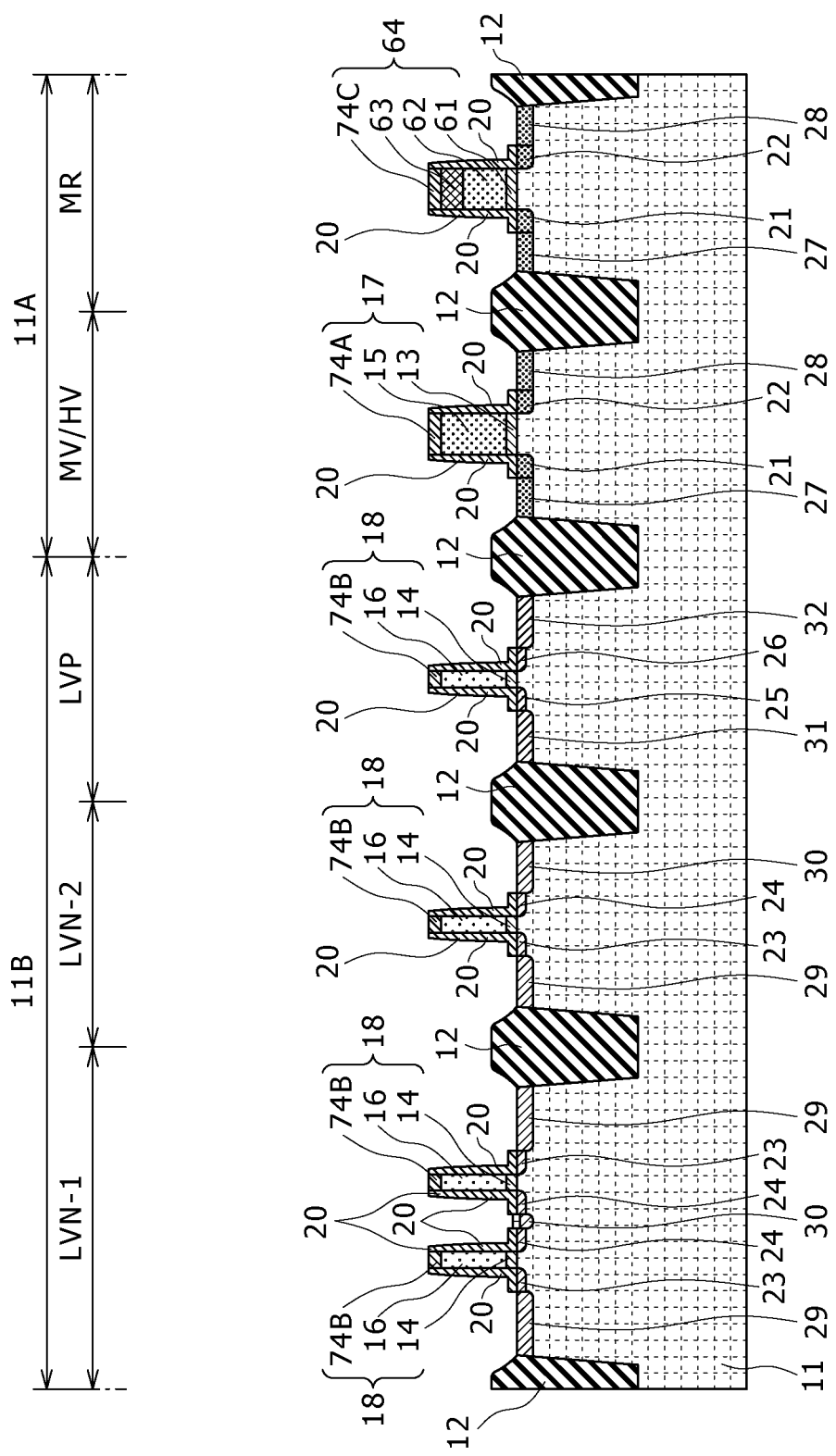
FIGS. 8A to 8N are respectively cross sectional views showing an example of manufacturing processes after a gate portion, dummy gate portions and a resistor portion are formed in accordance with the manufacturing method of the first embodiment or the second embodiment of the present invention.

Therefore, as shown in FIG. 8A, the device isolation regions 12 are formed in the semiconductor substrate 11. In this case, as an example, the region LVN-1, the region LVN-2, and the region LVP in which the low-voltage transistors (such as the MISFETs) are intended to be formed, respectively, the region MV/HV in which the middle-voltage transistor (such as the MISFET) and the high-voltage transistor (such as the MISFET) are intended to be formed, and the region MR in which the resistor is intended to be formed are isolated from one another by these device isolation regions 12. The region MV/HV includes not only the region in which the pattern density of the MISFET is dense, but also the region having the isolated pattern. In addition, both the region MV/HV as the formation region of the middle-voltage transistor and the high-voltage transistor, and the region MR in which the resistor is intended to be formed are given as the generic name of the first region 11A. Also, the region LVN-1 in which the N-channel MISFETs as the low-voltage transistors are intended to be densely formed, the region LVN-2 in which the N-channel MISFET as the low-voltage transistor is intended to be formed in isolation, and the region LVP in which the P-channel MISFET as the low-voltage transistor is intended to be formed are given as the generic name of the second region 11B.

Also, in accordance with the manufacturing method described in the first embodiment or the second embodiment, the gate portion 17, the dummy gate portions 18, and the resistor portion 64 are formed on the semiconductor substrate 11. Here, the gate portion 17 is composed of the hard mask 74A, the first gate electrode 15, and the gate insulating film 13. Each of the dummy gate portions 18 is composed of the hard mask 74B, the dummy gate electrode 16, and the dummy gate insulating film 14. Also, the resistor portion 64 is composed of the hard mask 74C, the resistor protecting layer 63, the resistor main body 62, and the insulating film 61.

Next, the sidewall portions of the gate portion 17, the dummy gate portions 18, and the resistor portion 64 are oxidized. The oxide film having a thickness of, for example, 2 nm is formed by performing the thermal oxidization at 800° C. for example. Subsequently, the insulating film for formation of the offset spacers on the semiconductor substrate 11 is formed so as to cover the gate portion 17, the dummy gate portions 18, and the resistor portion 64 by, for example, utilizing the LP-CVD method. This insulating film is formed from a silicon nitride film by, for example, utilizing the LP-CVD method. A film thickness of this silicon nitride film is set in the range of, for example, 6 to 10 nm. In this case, the silicon nitride film is formed to have a thickness of 10 nm. Next, allover etch back is performed for the insulating film, thereby forming the offset spacers (not shown).

Next, an ion implantation mask (not shown) is formed on a portion of the semiconductor substrate 11 corresponding to the second region 11B. The ion implantation mask is formed in such a way that after a resist mask is formed over the entire surface of the semiconductor substrate 11 by, for example, utilizing the resist application technique, it is processed by utilizing the lithography technique so that the first region 11A is exposed and the second region 11B is covered therewith. Next, an ion implantation is performed for the semiconductor substrate 11 by using the resulting resist film as the ion implantation mask, thereby forming the extension regions 21 and 22 on the surface side of the semiconductor substrate 11 and below the both sides of the gate portion 17 in the first region 11A, respectively. It is noted that when the N-channel MISFET and the P-channel MISFET need to be individually formed in the first region 11A, the ion implantation masks corresponding to the regions of the N-channel MISFET and the region of the P-channel MISFET, respectively, must be separately formed and the ion implantations corresponding to the N-channel MISFET and the P-channel MISFET, respectively, must be performed. After that, the ion implantation mask is removed away.

Next, an ion implantation mask (not shown) is formed on the semiconductor substrate 11. The ion implantation mask is formed such that after a resist film is formed over the entire surface of the semiconductor substrate 11 by, for example, utilizing the resist application technique, it is processed by utilizing the lithography technique so that the regions LVN-1 and LVN-2 of the second region 11B are exposed and both the first region 11A and the region LVP of the second region 11B are covered therewith. An ion implantation is performed for the semiconductor substrate 11 by using the ion implantation mask, thereby forming the extension regions 23 and 24 on the surface side of the semiconductor substrate 11 and below the both side of each of the dummy gate portions 18 of the regions LVN-1 and LVN-2 in the second region 11B, respectively. After that, the ion implantation mask is removed away.

Next, another ion implantation mask (not shown) is formed on the semiconductor substrate 11. The ion implantation mask is formed such that after a resist film is formed over the entire surface of the semiconductor substrate 11 by, for example, utilizing the resist application technique, it is processed by utilizing the lithography technique so that the region LVP of the second region 11B is exposed, and the regions LVN-1 and LVN-2 of the second region 11B and the first region 11A are covered therewith. An ion implantation is performed for the semiconductor substrate 11 by using the ion implantation mask, thereby forming the extension regions 25 and 26 on the surface side of the semiconductor substrate 11 and below the both side of the dummy gate portion 18 of the region LVP in the second region 11B, respectively. After that, the ion implantation mask is removed away.

In each of the ion implantations described above, the gate portion 17, the dummy gate portions 18, the resistor portion 64, and the offset spacers (not shown) also serve as the ion implantation mask. The N-channel MISFET and the P-channel MISFET are individually formed in the manner described above. As an example, with regard to the ion implantation conditions for the extension regions of the P-channel MISFET, boron (B) is used as the ion implantation species, the implantation energy is set at 0.5 keV, and the dose is set at $5\times10^{14}/cm^2$. On the other hand, with regard to the ion implantation conditions for the extension regions of the N-channel MISFET, arsenic (As) is used as the ion implantation species, the implantation energy is set at 1.0 keV, and the dose is set at $5\times10^{14}/cm^2$. It is noted that any pair(s) of extension regions 21 and 22, extension regions 23 and 24, and extension regions 25 and 26 may be formed first.

Next, an insulating film for formation of the sidewalls is formed on the semiconductor substrate 11 by, for example, utilizing the LC-CVD method so as to cover the gate portion 17, the dummy gate portion 18, the resistor portion 64, the offset spacers (not shown) and the like. The insulating film is formed in the form of a laminated film of a silicon nitride film (having a thickness of, for example, 15 to 30 nm), and a Tetra Ethyl Ortho Silicate (TEOS) film (having a thickness of, for example, 40 to 60 nm) by, for example, utilizing the LP-CVD method. Next, the overall etch back is performed for the insulating film, thereby forming the sidewalls 20 on the side portions of the gate portion 17, the dummy gate portions 18, and the resistor portion 64 through the offset spacers (not shown), respectively.

Next, an ion implantation mask (not shown) is formed on a portion of the semiconductor substrate corresponding to the second region 11B. The ion implantation mask is formed such that after a resist film is formed over the entire surface of the semiconductor substrate 11 by, for example, utilizing the resist application technique, it is processed by utilizing the lithography technique so that the first region 11A is exposed and the second region 11B is covered therewith. Next, an ion implantation is performed for the semiconductor substrate 11 by using the resist film as the ion implantation mask, thereby forming the source/drain regions 27 and 28 on the surface side of the semiconductor substrate 11 and below the both sides of each of the gate portion 17 and the resistor portion 64 in the first region 11A through the corresponding ones of the extension regions 21 and 22, respectively. In each of the ion implantations, the gate portion 17, the resistor portion 64, the sidewalls 20 (including the offset spacers 19), and the like also serve as the ion implantation mask. After that, the ion implantation mask is removed away.

Likewise, an ion implantation mask (not shown) is formed on a portion of the semiconductor substrate 11 corresponding to the first region 11A and the region LVP in the second region 11B. The ion implantation mask is formed such that after a resist film is formed over the entire surface of the semiconductor substrate 11 by, for example, utilizing the resist application technique, it is processed by utilizing the lithography technique so that the regions LVN-1 and LVN-2 of the second region 11B are exposed, and the first region 11A and the region LVP of the second region 11B are covered therewith. Next, an ion implantation is performed for the semiconductor substrate 11 by using the resist film as the ion implantation mask, thereby forming the source/drain regions 29 and 30 on the surface side of the semiconductor substrate 11 and below the both sides of each of the dummy gate portions 18 of the regions LVN-1 and LVN-2 in the second region 11B through the corresponding ones of the extension regions 23 and 24, respectively. In each of the ion implantations, the dummy gate portions 18, the sidewalls 20 (including the offset spacers) and the like also serve as the ion implantation mask. After that, the ion implantation mask is removed away.

Likewise, an ion implantation mask (not shown) is formed on a portion of the semiconductor substrate 11 corresponding to the first region 11A and the regions LVN-1 and LVN-2 in the second region 11B. The ion implantation mask is formed such that after a resist film is formed over the entire surface of the semiconductor substrate 11 by, for example, utilizing the resist application technique, it is processed by utilizing the lithography technique so that the region LVP of the second region 11B is exposed, and the first region 11A and the regions LVN-1 and LVN-2 of the second region 11B are covered therewith. Next, an ion implantation is performed for the semiconductor substrate 11 by using the resist film as the ion implantation mask, thereby forming the source/drain regions 31 and 32 on the surface side of the semiconductor substrate 11 and below the both sides of the dummy gate portion 18 of the region LVP in the second region 11B through the extension regions 25 and 26, respectively. In the ion implantation described above, the dummy gate portion 18, the sidewalls 20 (including the offset spacers) and the like also serve as the ion implantation mask. After that, the ion implantation mask is removed away.

In such a manner, the N-channel MISFET and the P-channel MISFET are individually formed in the first region 11A. It is noted that the order of the ion implantation processes is by no means limited to the order described above, and any pair(s) of source/drain regions 27 and 28 in the first region 11A, and source/drain regions 29 and 30 of the regions LVN-1 and LVN-2 in the second region 11B, and source/drain regions 31 and 32 of the region LVP in the second region 11B may be formed first or last.

Subsequently, the TEOS portions of the sidewalls 20 are removed away. This removal process is carried out by, for example, utilizing the wet etching method using a dilute hydrofluoric acid. After that, a heat treatment for activating the implanted impurity ions is performed. For example, in this heat treatment, the activation for the impurity ions is performed at 1,000° C. for 5 seconds, thereby forming the source/drain regions 27 to 32 of the MISFETs. As an example, with regard to the ion implantation conditions for the source/drain regions of the P-channel MISFET, boron (B)

is used as the ion implantation species, the implantation energy is set at 3 keV, and the dose is set at $3\times10^{15}/\text{cm}^2$. On the other hand, with regard to the ion implantation conditions for the source/drain regions of the N-channel MISFET, phosphorus (P) is used as the ion implantation species, the implantation energy is set at 10 keV, and the dose is set at $3\times10^{15}/\text{cm}^2$. In addition, a spike RTA can also be performed as the heat treatment for the purpose of promoting the dopant activation and suppressing the diffusion thereof.

Figure 8B:
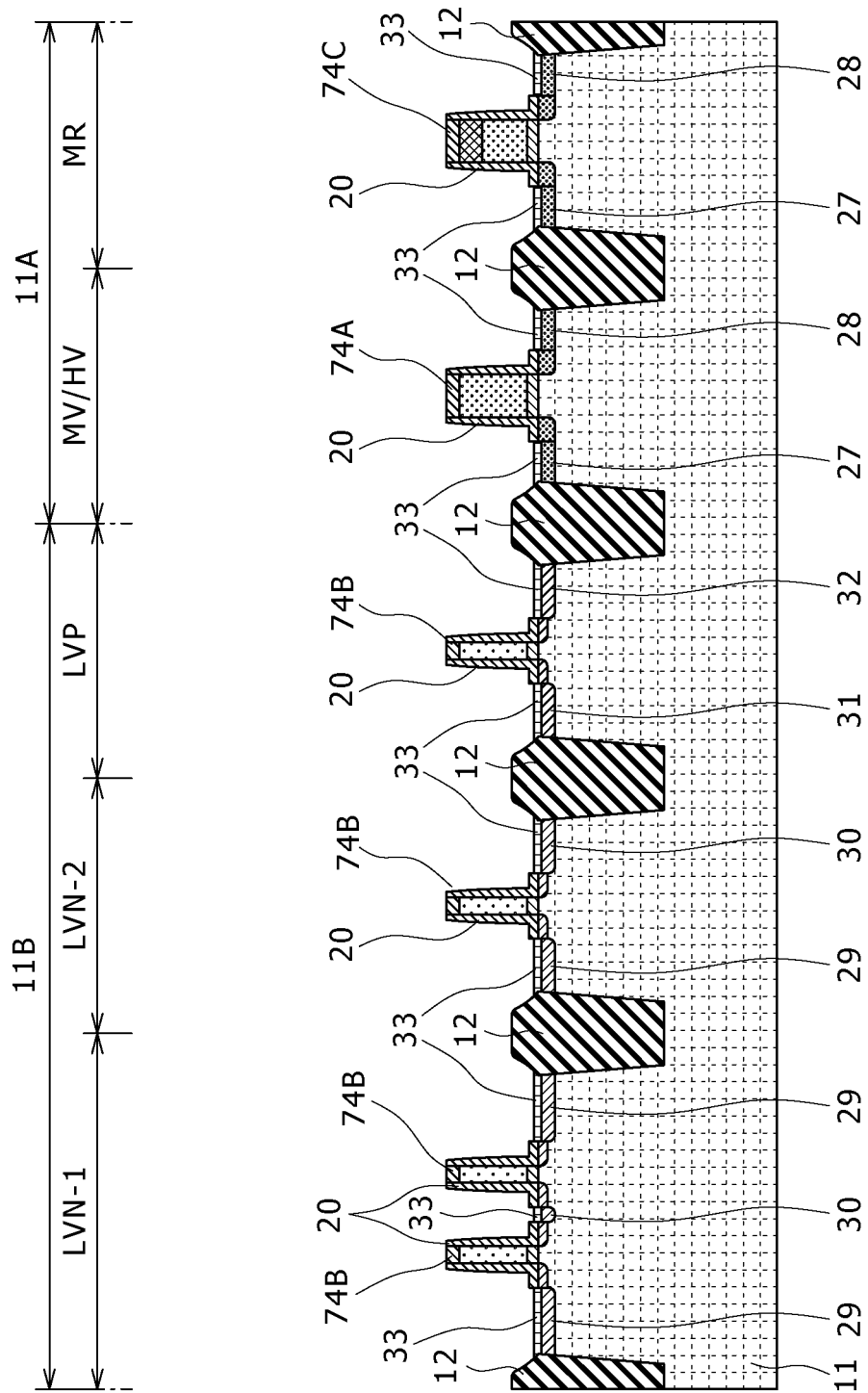

Next, as shown in FIG. 8B, the silicide layer 33 is formed on each of the source/drain regions 27 to 32. Firstly, a metallic layer for formation of silicide is formed over the entire surface. In this case, as an example, the metallic layer is made of cobalt (Co). A cobalt layer is deposited to have a thickness of, for example, 6 to 8 nm, that is, 10 nm in this case by, for example, utilizing the sputtering method, thereby forming the metallic layer. Next, an anneal is performed at 450° C. for 30 seconds and another anneal is then performed at 750° C. for 30 seconds, so that the metallic layer is reacted with only silicon (Si) of the semiconductor substrate 11, thereby forming the silicide layer 33. Since the metallic layer is made of cobalt, the silicide layer 33 becomes cobalt silicide (for example, CoSi). After that, unreacted cobalt left on the insulating films (such as the device isolation regions 12, the hard masks 74A, 74B and 74C, and the sidewalls 20) is removed by utilizing the wet etching method using the mixed liquid of a sulfuric acid ($H_2SO_4$) and a hydrogen peroxide ($H_2O_2$). Subsequently, a heat treatment is performed to form a cobalt silicide ($CoSi_2$) layer having a low resistance value. The RTA, for example, is performed as this heat treatment at a temperature of 650 to 850° C. for 30 seconds. In addition, the metallic layer can also be made of nickel (Ni) or nickel platinum (NiPt) instead of being made of cobalt (Co), thereby forming a nickel silicide ($NiSi_2$) layer. In any case, the temperature in the RTA can be suitably set.

Next, as shown in FIG. 8C, an interlayer insulating film is formed over the entire surface of the semiconductor substrate 11 so as to cover the gate portion 17, the dummy gate portion 18, the resistor portion 64 and the like. Before that, firstly, the liner film 36 is formed. Also, the first interlayer insulating film 38 becoming that interlayer insulating film is formed on the liner film 36. The liner film 36, for example, is formed from a silicon nitride film and has a thickness of, for example, 10 nm. In addition, the first interlayer insulating film 38 is formed from a silicon oxide film. For example, the first interlayer insulating film 38 is formed by, for example, utilizing a chemical vapor deposition (CVD) method using ozone ($O_3$)-TEOS. Next, the first interlayer insulating film 38 and the liner film 36 which overlie the gate portion 17, the dummy gate portions 18, and the resistor portion 64 are polished by utilizing the CMP method until the hard masks 74A, 74B and 74C are exposed. At this time, the hard masks 74A, 74B and 74C are left.

Figure 8D:
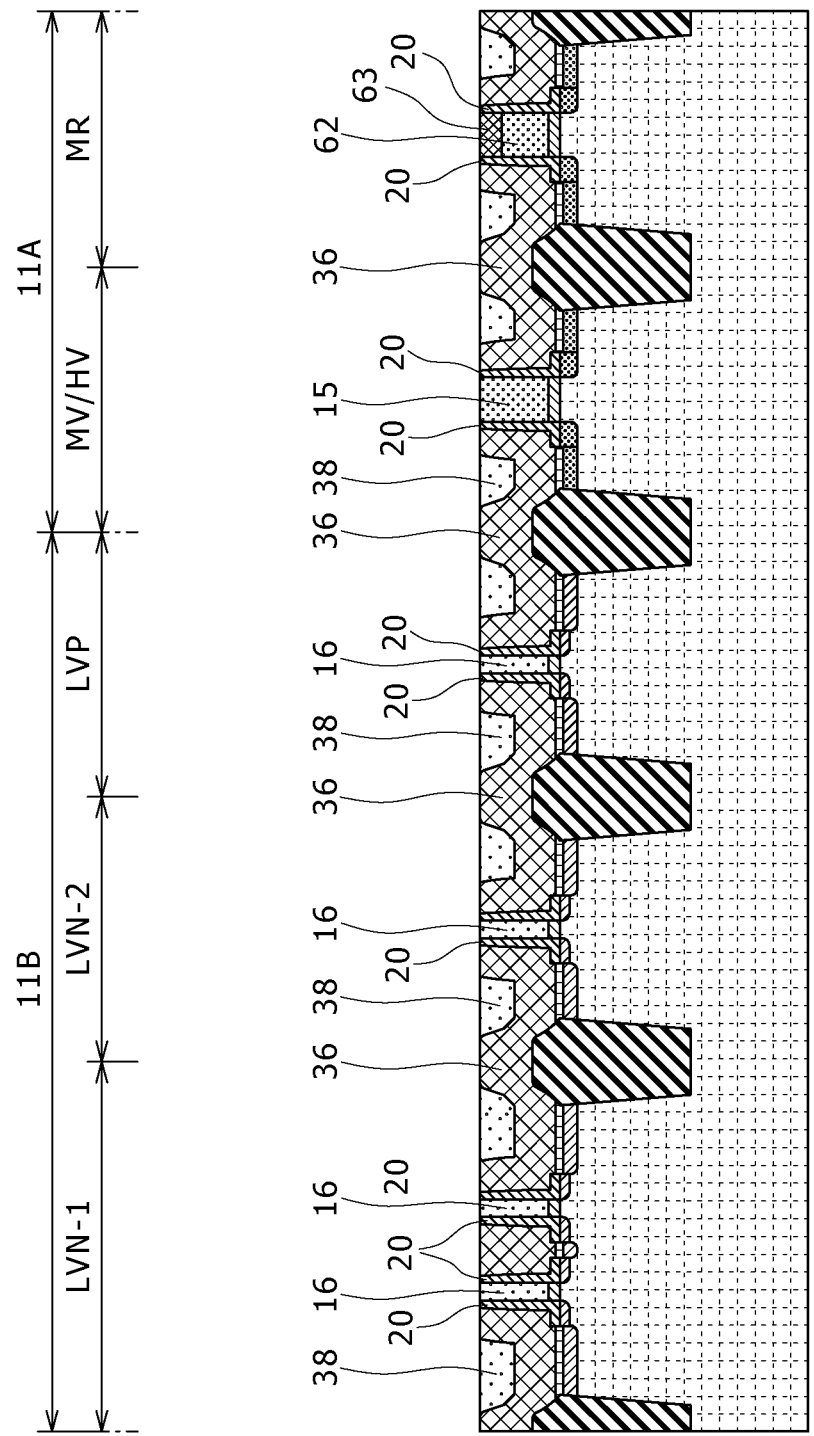

Next, as shown in FIG. 8D, the hard mask 74A (refer to FIG. 8C) on the first gate electrode 15 in the first region 11A, the hard masks 74B (refer to FIG. 8C) on the dummy gate electrodes 16 in the second region 11B, and the hard mask 74C (refer to FIG. 8C) on the resistor protecting layer 63 in the first region 11A are removed away by utilizing either the dry etching method or the CMP method. For example, when the hard masks 74A, 74B and 74C are removed away by utilizing the CMP method, the surfaces of the first gate electrode 15, the dummy gate electrodes 16, the resistor protecting layer 63, the first interlayer insulating film 38, the liner film 36, the sidewalls 20, and the like are planarized to have approximately the same flat surface-like shape.

With regard to an example of the conditions in the CMP method, a polishing pad made of an urethane foam is used as a polishing pad, a polishing pressure is set at 300 hPa, a rotating speed of a machine platen is set at 100 rpm, and a rotating speed of a polishing head is set at 107 rpm. Also, a ceria system slurry is used as a polishing slurry, a slurry flow rate is set at 200 $cm^3$/min., and a slurry temperature is set in the range of 25 to 30° C. In addition, the over-polishing is performed for a polishing time of 30 seconds ranging from the just polishing based on the detection of the torque end point.

In the phase of the CMP process described above, the hard mask 74A, made of the silicon nitride, on the first gate electrode 15 in the first region 11A, and the hard mask 74B, made of the silicon nitride, in the second region 11B are polished out to disappear. However, the resistor main body 62 based on which the resistance value is determined is prevented from being trimmed because the resistor protecting layer 63 is formed on the resistor main body 62 in the region MR. Therefore, there is no dispersion in the resistance value of the resistor main body 62.

Figure 8E:
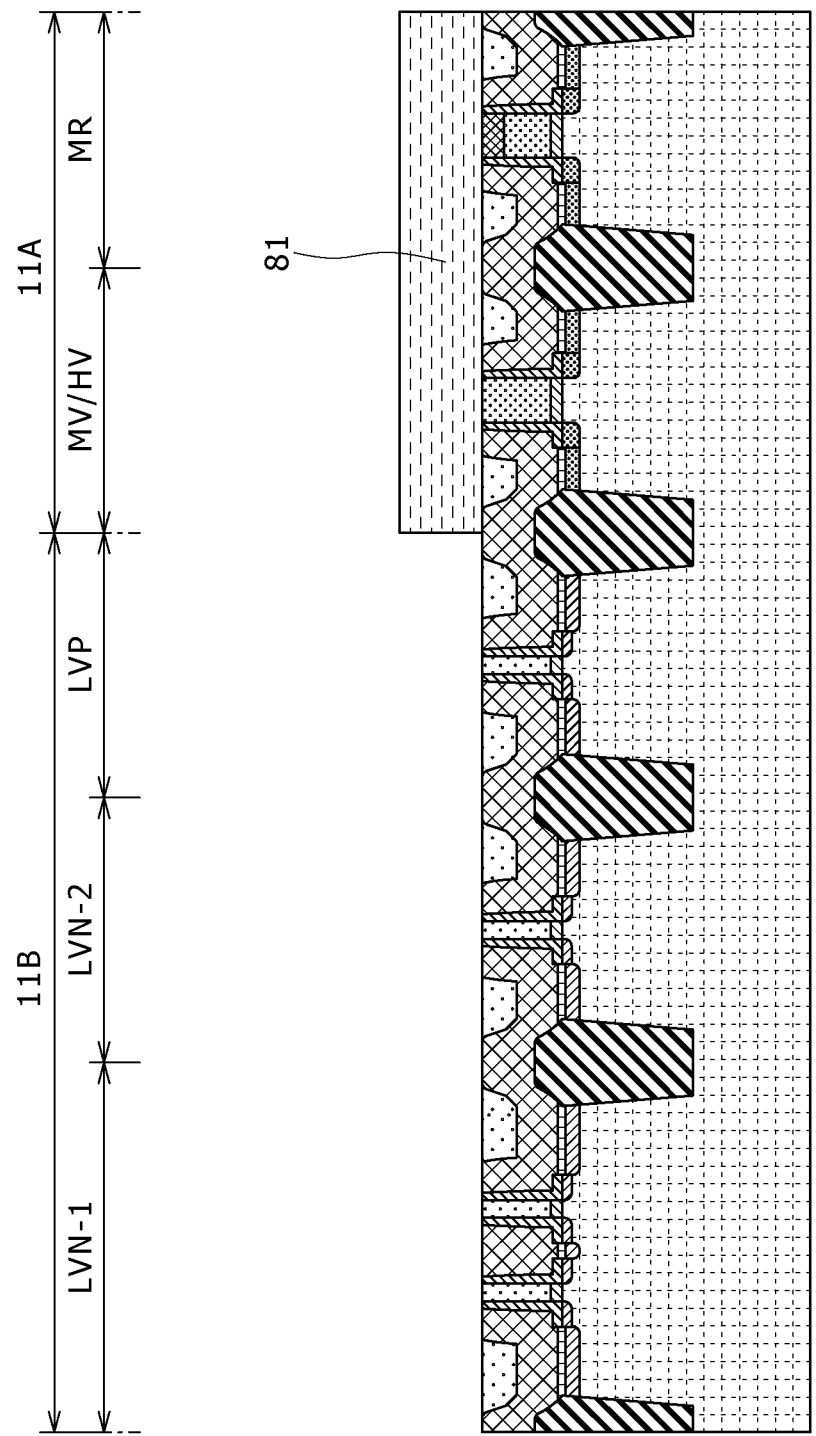

Next, as shown in FIG. 8E, an etching mask 81 is formed by utilizing the resist application technique and the lithography technique so as to cover the first region 11A. Therefore, no second region 11B is covered with the etching mask 81.

Next, as shown in FIG. 8F, the dummy gate electrodes 16 (refer to FIG. 8D) are removed with the etching mask 81 by, for example, utilizing the dry etching method, thereby forming the trenches 42 for gate formation. After that, the etching mask 81 is removed away.

Figure 8G:
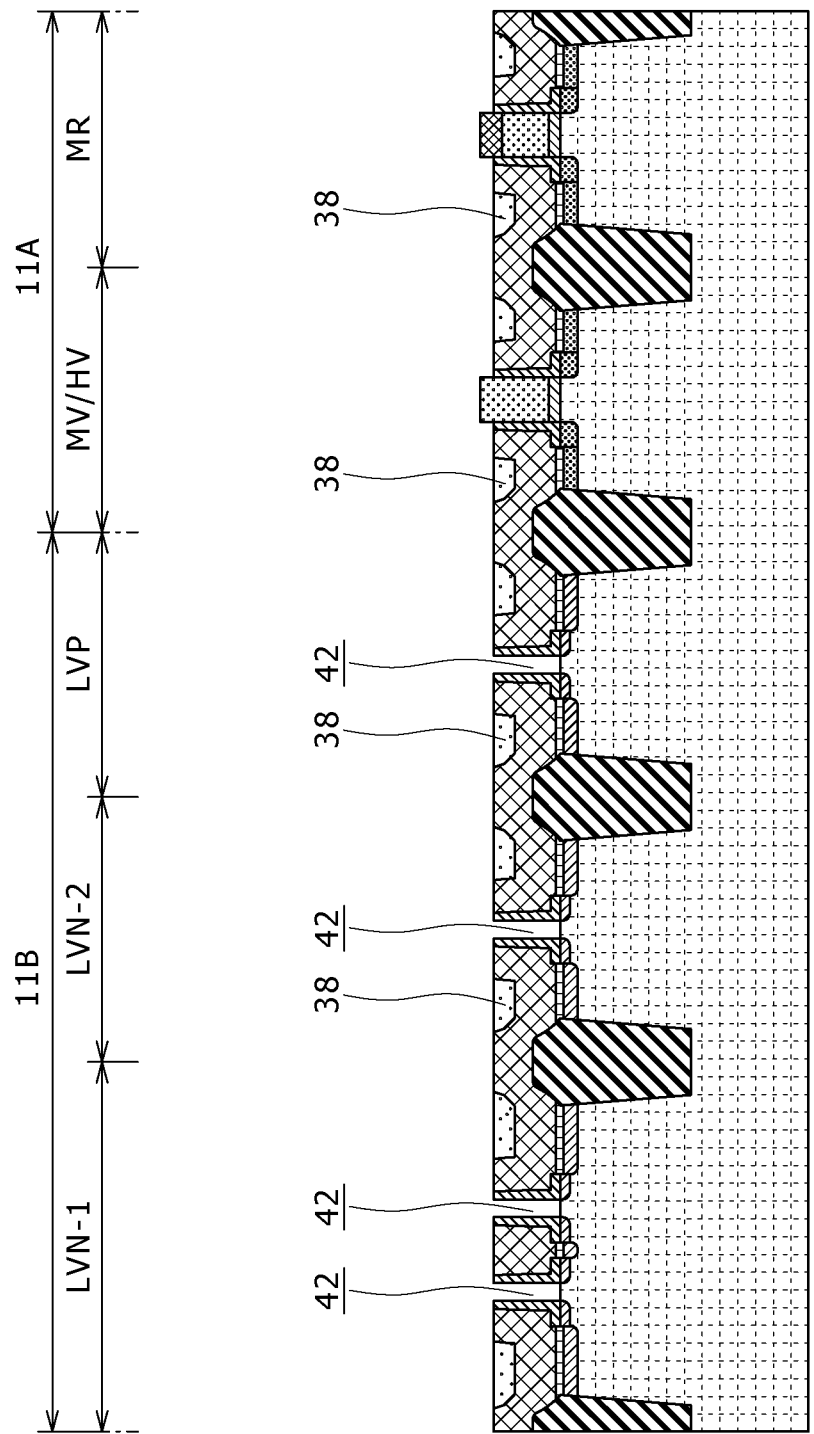

Moreover, as shown in FIG. 8G, the dummy gate insulating films 14 (refer to FIG. 8A) are removed by utilizing the wet etching method using a dilute hydrofluoric acid, thereby completing the trenches 42 for gate formation. At this time, the upper portion of the first interlayer insulating film 38 is also etched away.

Figure 8H:
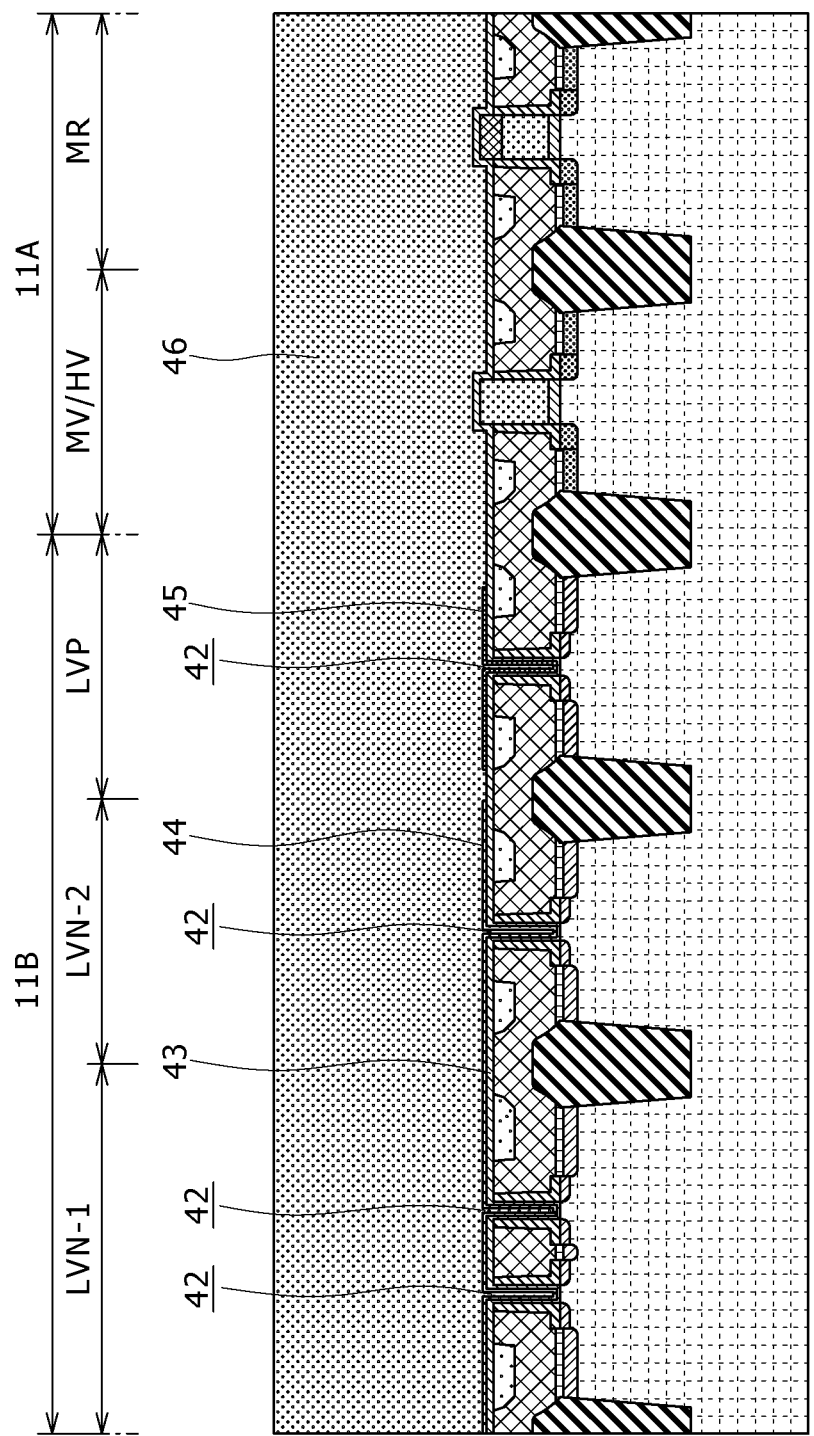

Next, as shown in FIG. 8H, the second gate insulating film 43 is formed on each of the inner surfaces of the trenches 42 for gate formation. Next, the work function controlling films 44 and 45 for determining the work functions are formed on each of the inner surfaces of the trenches 42 for gate formation in the regions LVN-1 and LVN-2 through the second gate insulating film 43 and on the inner surface of the trench 42 for gate formation in the region LVP through the second gate insulating film 43, respectively.

Firstly, the metal or metallic compound layer having a work function suitable for the N-channel MISFET is deposited by utilizing the film deposition method such as an atomic layer deposition (ALD) method or the CVD method. In this example, for example, the hafnium silicide ($HfSi_x$) layer is deposited to have a thickness of, for example, about 10 to about 100 nm, thereby forming the work function controlling film 44. Subsequently, there is removed the portion of the work function controlling film 44 overlying the region LVP in the second region 11B, and the first region 11A. As a result, the remaining work function controlling film 44 is left so as to overlie the region LVN-1 and the region LVN-2 in the second region 11B.

Next, the metal or metallic compound layer having a work function suitable for the P-channel MISFET is deposited by utilizing the film deposition method such as the ALD method or the CVD method. In this example, for example, a titanium nitride (TiN) layer is deposited to have a thickness of, for example, about 5 to about 50 nm, thereby forming the work function controlling film 45. Subsequently, there is removed the portion of the work function controlling film 45 overlying the region LVN-1 and the region LVN-2 in the second region 11B, and the first region 11A. As a result, the remaining work function controlling film 45 is left so as to overlie the region LVP in the second region 11B. For example, a ruthenium (Ru) layer or the like can also be deposited for the P-channel MISFET.

Any of the work function controlling films 44 and 45 may be formed first.

Next, the conductive film 46 is formed as a conductive material over the entire surface so as to be filled in each of the insides of the trenches 42 for gate formation. The conductive film 46, for example, is made of the metallic material having an electrical resistance value which is smaller than that of each of the work function controlling films 44 and 45. In this example, as an example, the conductive material 46 is made of tungsten (W).

Figure 8I:
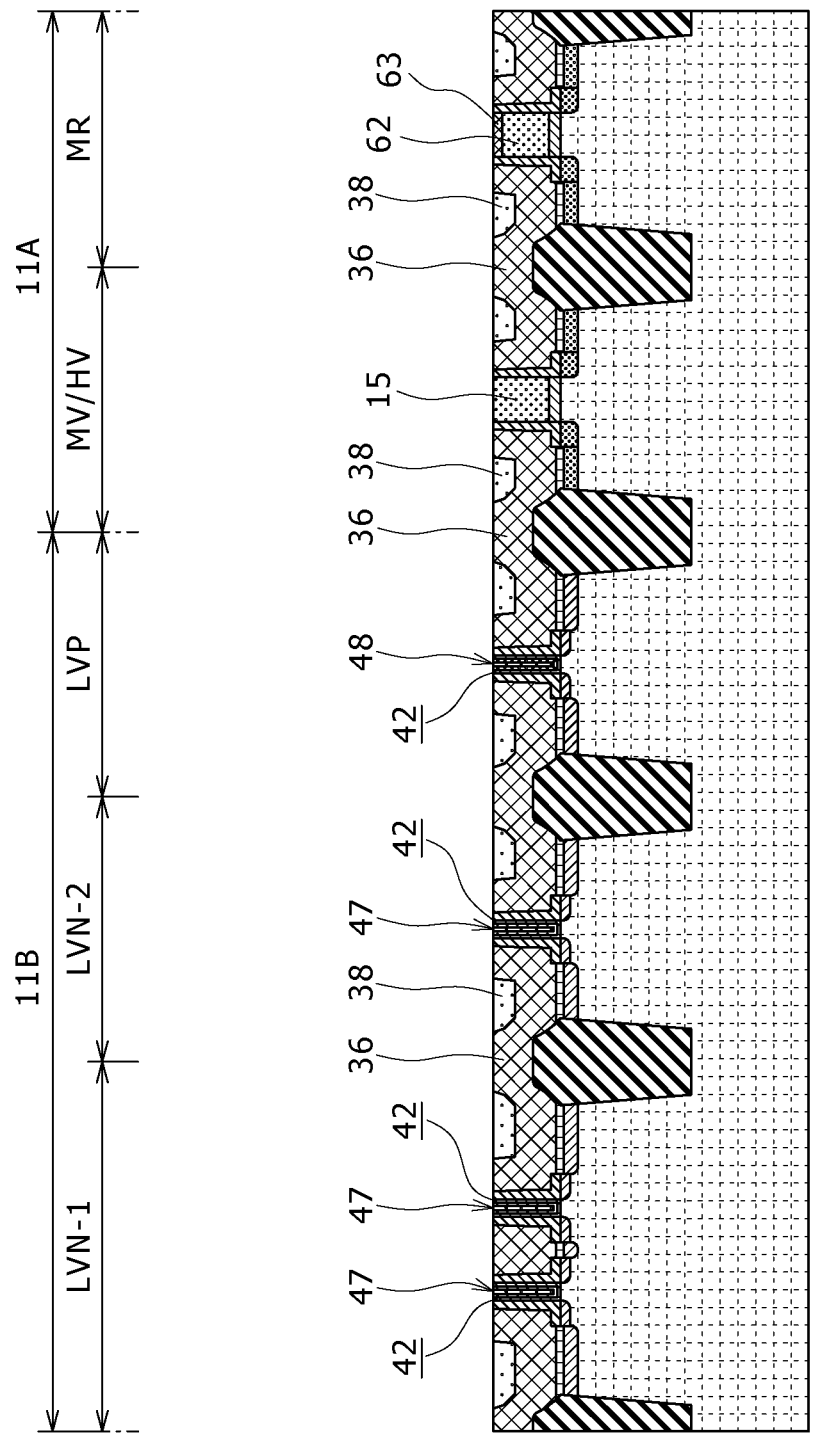

Next, as shown in FIG. 8I, there is removed the extra conductive film 46 (refer to FIG. 8H) other than the conductive film 46 filled in each of the insides of the trenches 42 for gate formation. This removal process is carried out by, for example, utilizing the CMP method. In the phase of utilizing the CMP method, the liner film 36, the first interlayer insulating film 38, and the like serve as the polishing stopper. As a result, the second gate electrode 47 of each of the low-voltage transistors (N-channel MISFETs) of the regions LVN-1 and LVN-2 in the second region 11B is formed from the conductive film 46 and the work function controlling film 44 which are left in each of the corresponding ones of the trenches 42 for gate formation. Also, the second gate electrode 48 of the low-voltage transistor (P-channel MISFET) of the region LVP in the second region 11B is formed from the conductive film 46 and the work function controlling film 45 which are left in the corresponding one of the trenches 42 for gate formation.

In the phase of the CMP process described above, the upper portion of the first gate electrode 15 in the first region 11A is trimmed. However, the resistor main body 62 based on which the resistance value is determined is prevented from being trimmed because the resistor protecting layer 63 is formed on the resistor main body 62 of the region MR in the first region 11A. Therefore, there is no dispersion in the resistance value of the resistor main body 62.

Figure 8J:
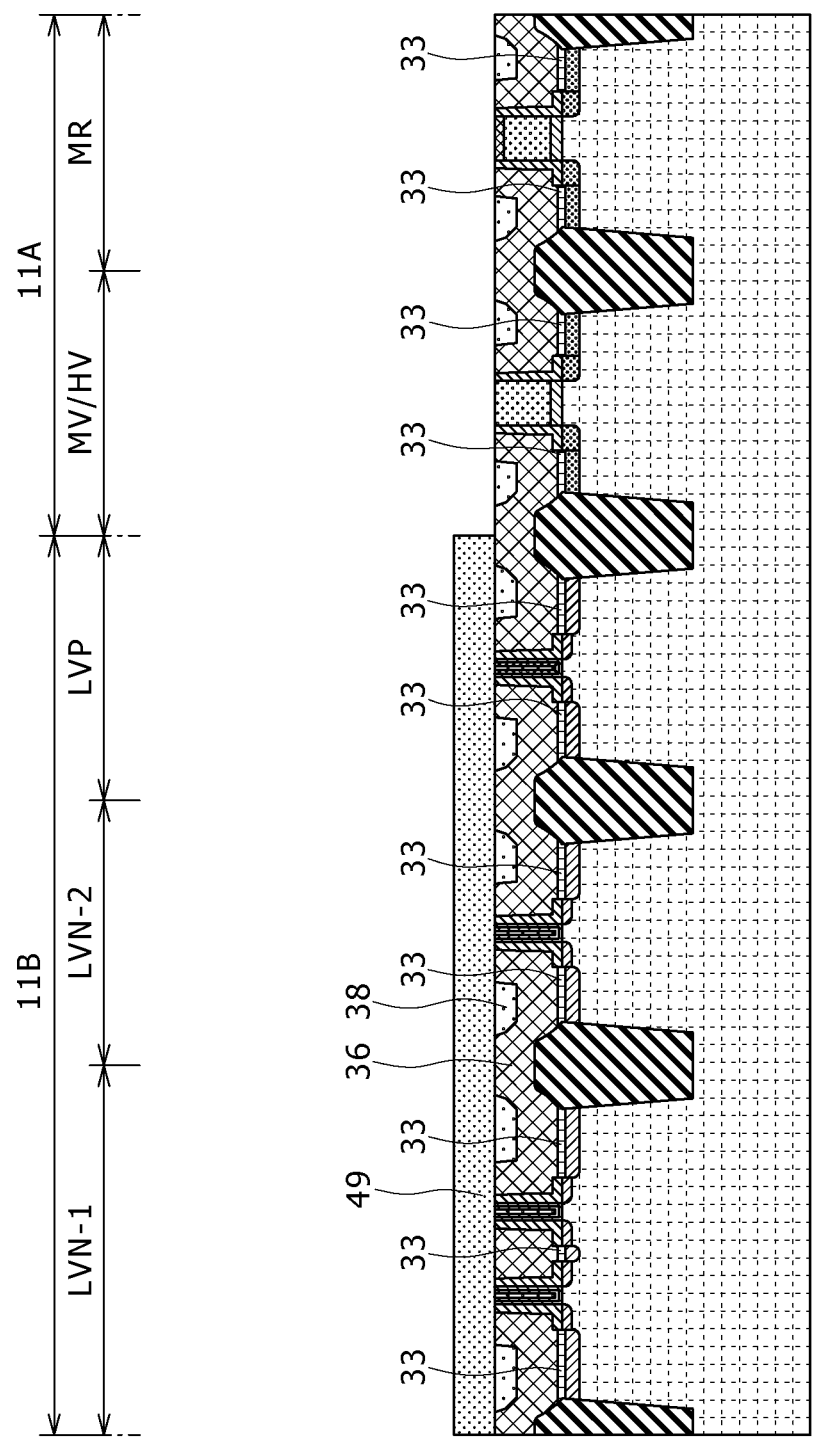

Next, as shown in FIG. 8J, the protective film 49 is formed over all the surfaces of the first interlayer insulating film 38, the liner film 36 and the like. The protective film 49 is formed from either a silicon oxide ($SiO_2$) film or a silicon nitride (SiN) film by, for example, utilizing the plasma CVD method. For example, when the protective film 49 is formed from the silicon oxide film, an example of the conditions in the CVD method is described as follows: oxygen ($O_2$) (flow rate: 600 $cm^3$/min.) and tetra ethyl silicate (TEOS) (flow rate: 800 $cm^3$/min.) are used as the raw material gas, a pressure of a deposition ambient atmosphere is set at 1.09 kPa, an RF power of a CVD system is set at 700 W, and a substrate temperature is set at 400° C. Since the protective film 49 can be deposited at a temperature of 450° C. or less, the thermal damage is prevented from being incurred on the silicide layer 33 which is previously formed.

Next, an etching mask (not shown) is formed by utilizing the resist application technique and the lithography technique. Thereafter, the portion of the protective film 49 in the first region 11A is removed by utilizing the dry etching method using the etching mask, and thus the remaining protective film 49 is left so as to cover the second region 11B.

Figure 8K:
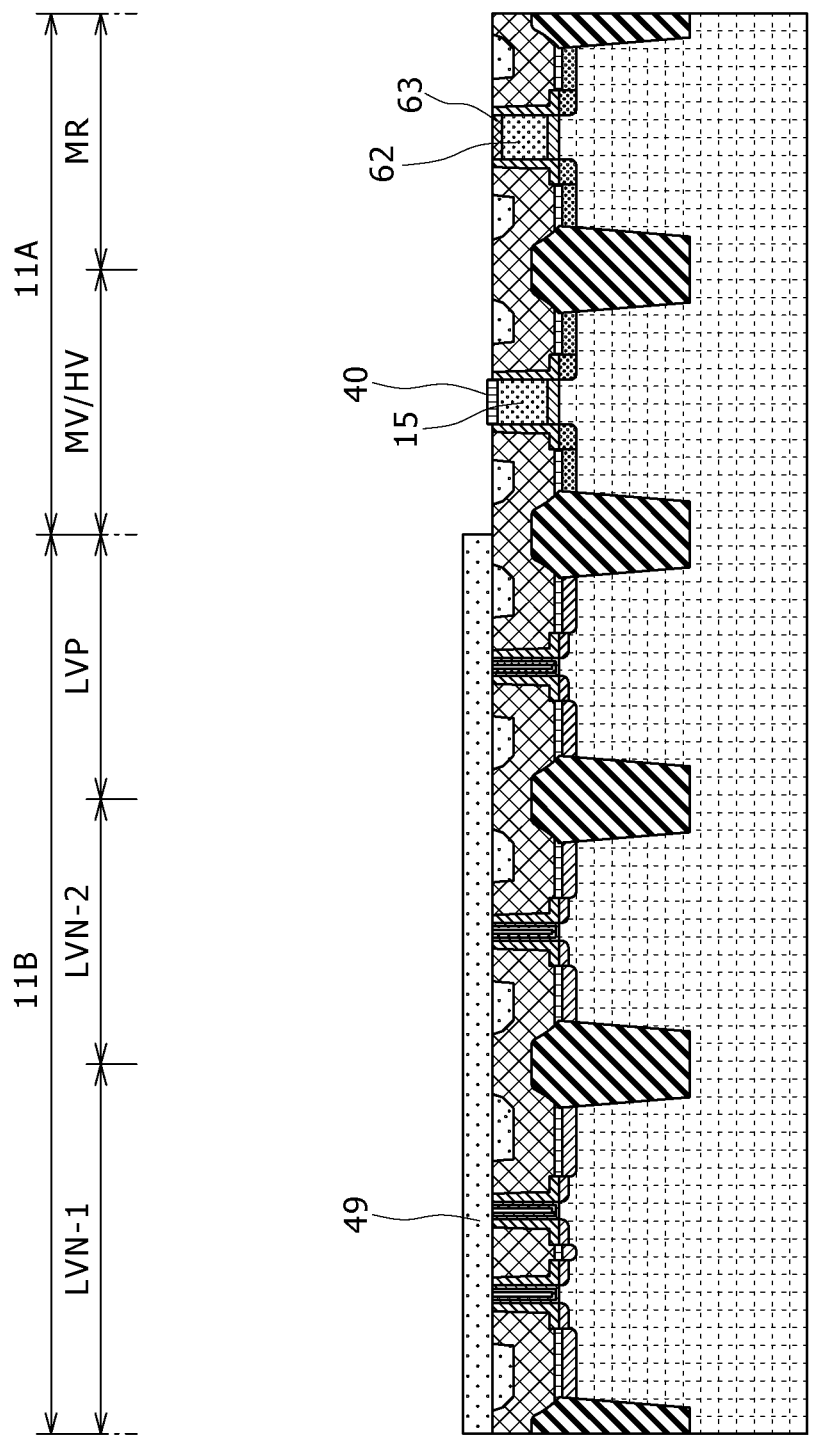

Next, as shown in FIG. 8K, the silicide layer 40 is formed on the first gate electrode 15. Firstly, the metallic layer for formation of the silicide layer 40 is formed over the entire surface. In this case, as an example, the metallic layer is made of either nickel (Ni) or nickel platinum (NiPt). In this case, the metallic layer is made of nickel (Ni). A nickel layer is deposited to have a thickness of, for example, 6 to 8 nm by, for example, utilizing the sputtering method, thereby forming the metallic layer. Next, the RTA is performed at a temperature of 350° C. or less allowing the silicidization for, for example, 30 seconds, so that the metallic layer is reacted with only silicon (Si) of the first gate electrode 15, thereby forming the silicide layer 40. Since the metallic layer is made of nickel, the silicide layer 40 is made of nickel silicide. After that, unreacted nickel left on the insulating films is removed away by utilizing the wet etching method using aqua regia. Subsequently, a heat treatment is performed, thereby forming a nickel silicide ($NiSi_2$) layer having a low resistance value. The RTA, for example, is performed as the heat treatment at a temperature of 450° C. or less allowing the low resistance value for 30 seconds. In the silicidization reaction described above, the silicide layer 40 is formed only on the first electrode 15 because the protective film 49 and the resistor protecting layer 63 serve as a mask for preventing the silicidization. Therefore, the resistance value of the first gate electrode 15 can be reduced while the resistance value of the resistor main body 62 is held at given one.

Next, as shown in FIG. 8L, the second interlayer insulating film 51 is formed over all the surfaces of the liner film 36, the first interlayer insulating film 38, the silicide layer 40, the protective film 49, and the like. The second interlayer insulating film 51, for example, is formed from a silicon oxide film. With regard to the film deposition conditions, the film deposition temperature is set at a temperature of 450° C. or less by, for example, utilizing the high density plasma (HDP) CVD method.

Figure 8M:
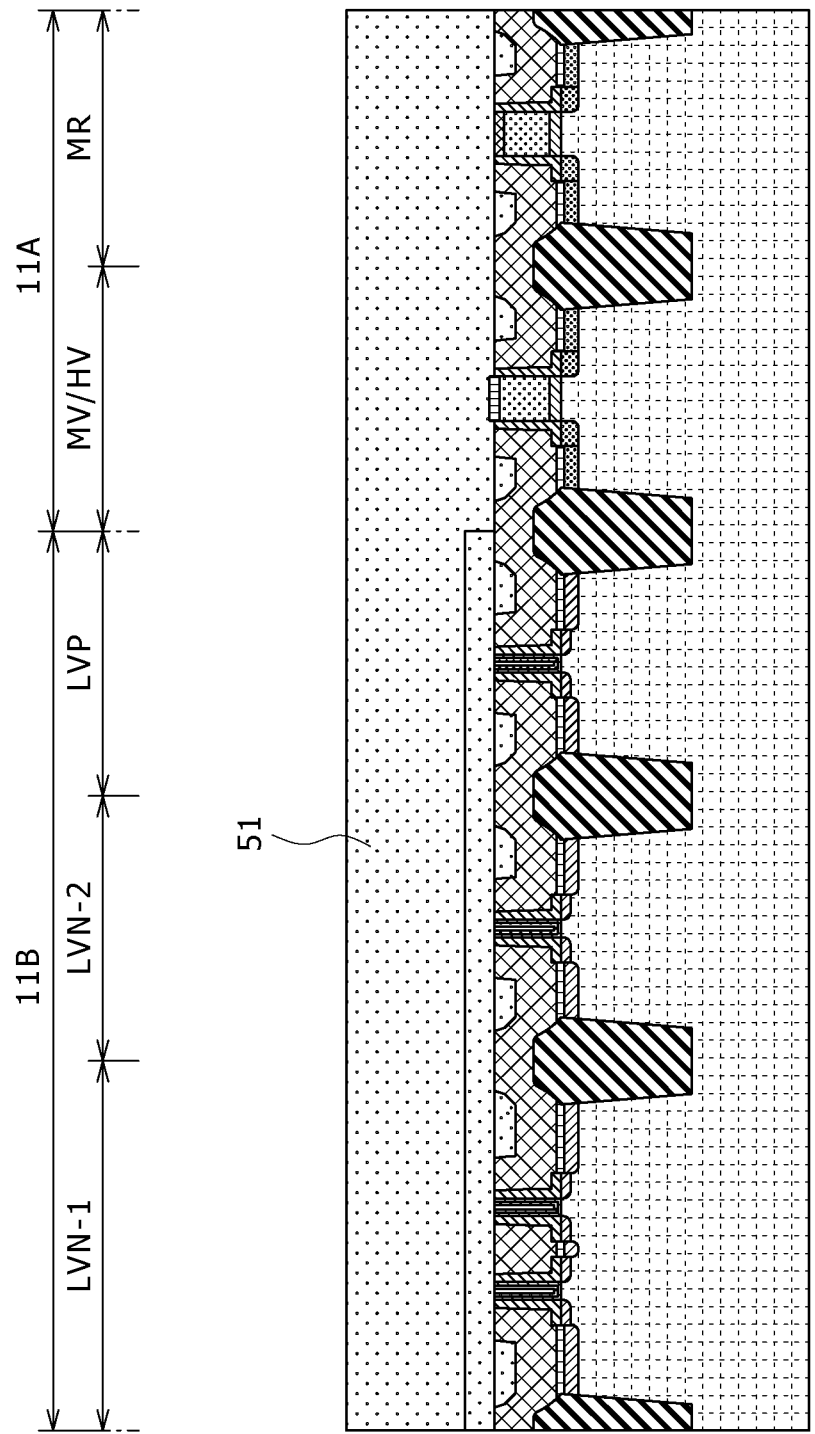

Next, as shown in FIG. 8M, the surface of the second interlayer insulating film 51 is planarized by, for example, utilizing the CMP method.

Figure 8N:
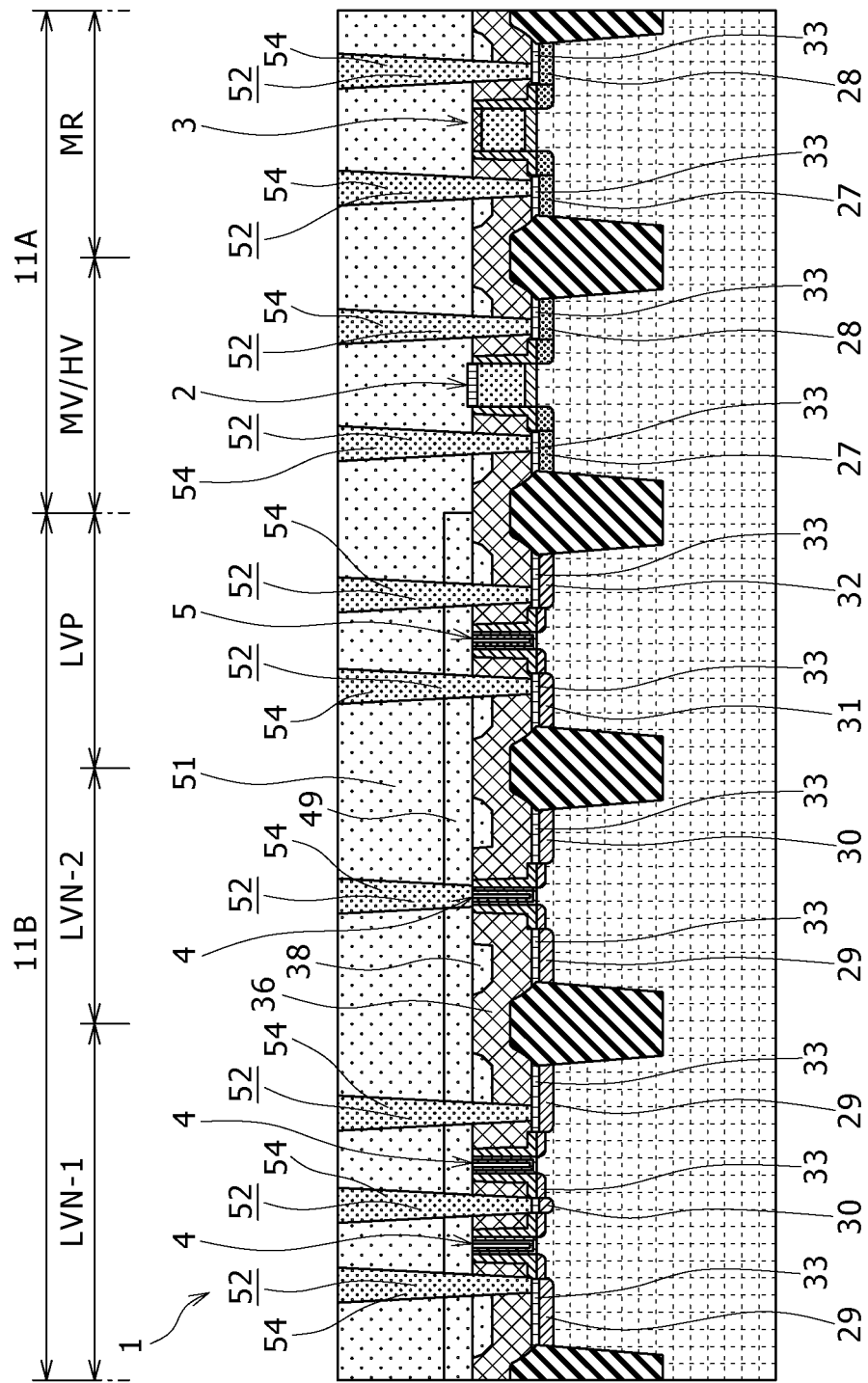
Figure 9A:
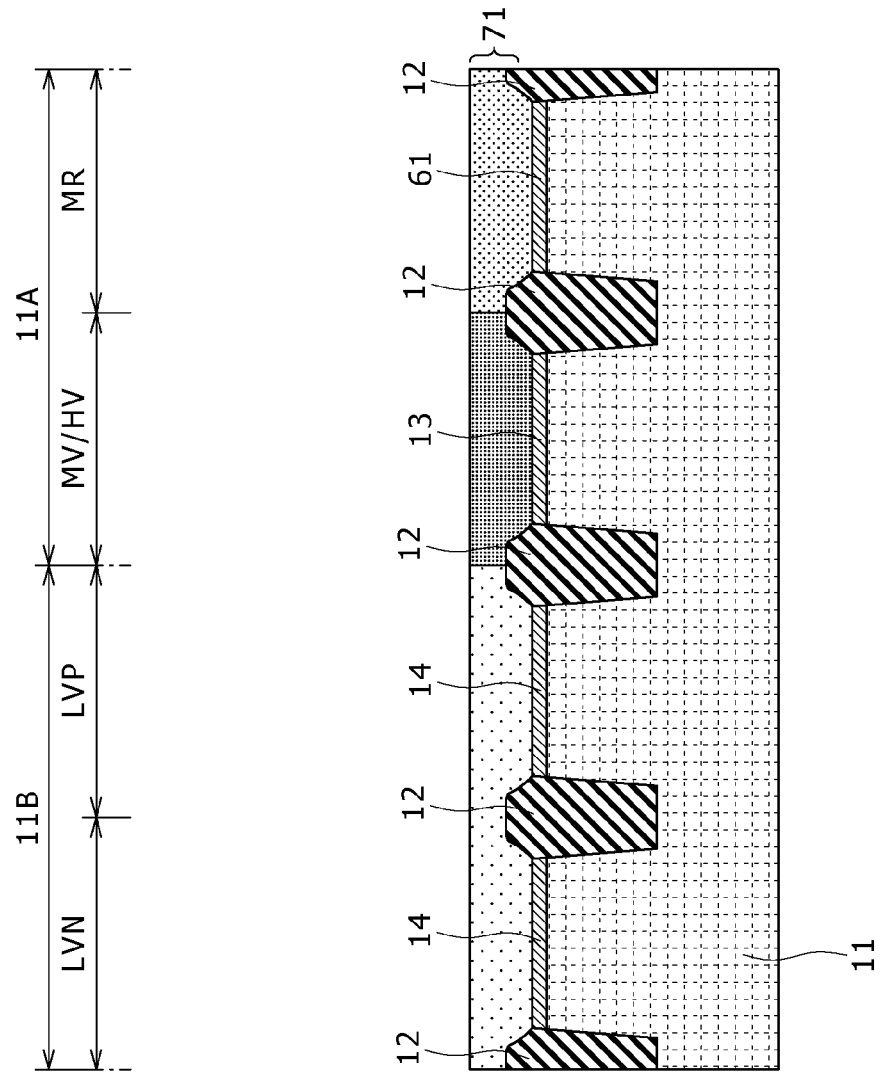
Figure 9B:
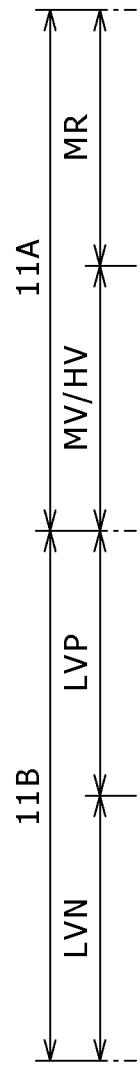
Figure 9B:
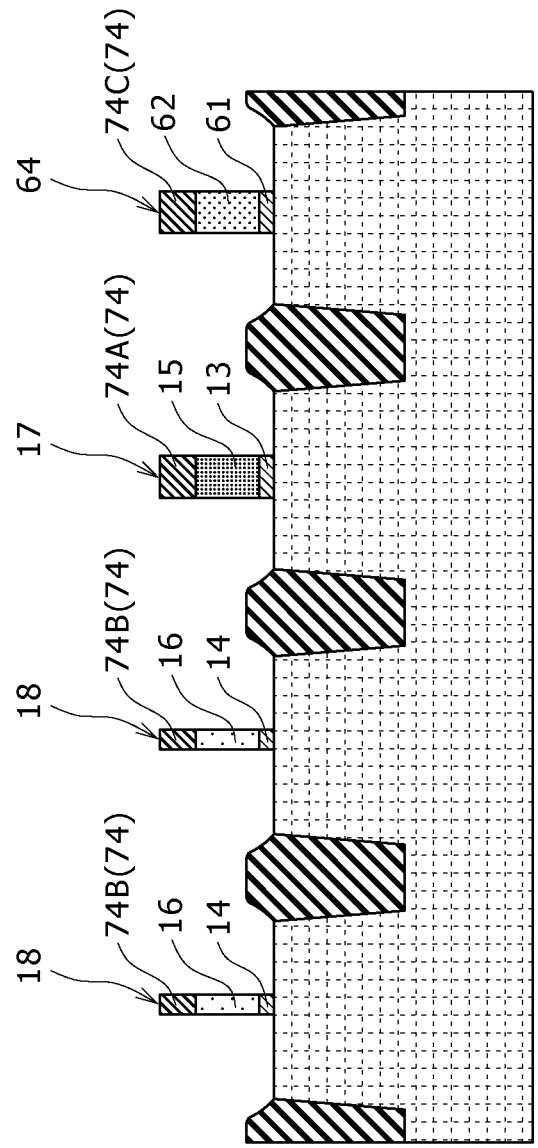
Figure 9D:
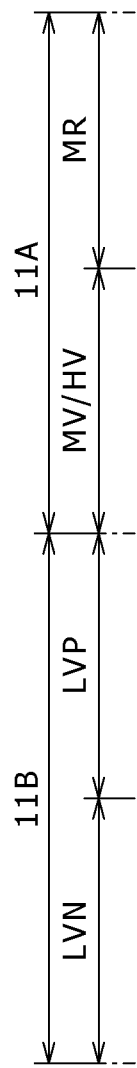
Figure 9D:
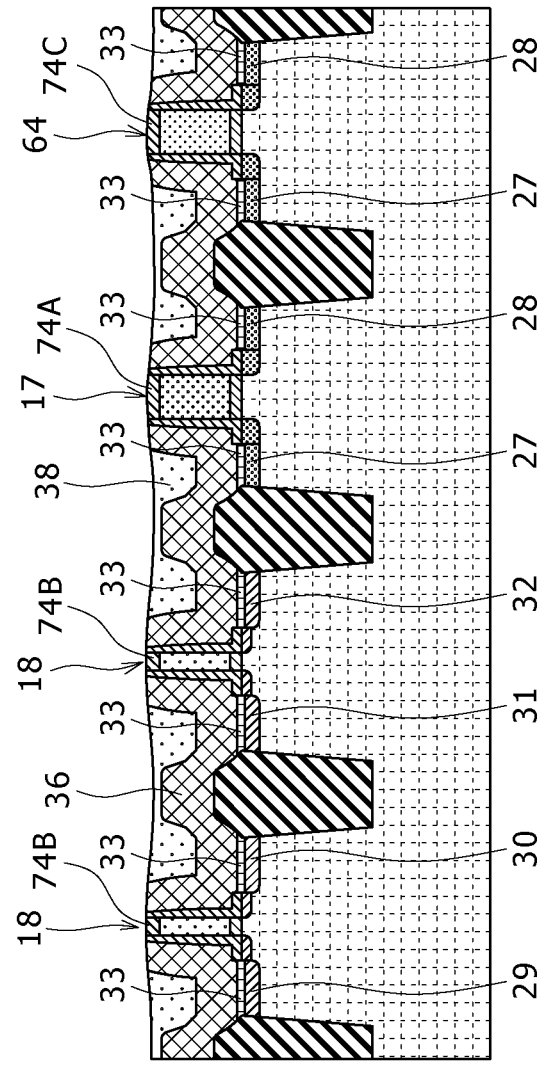
Figure 9E:
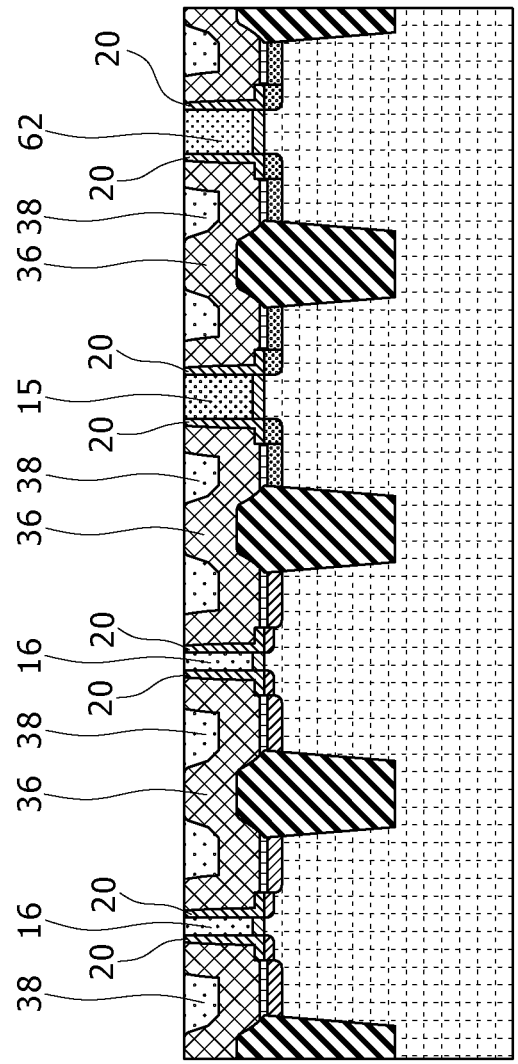
Figure 9E:
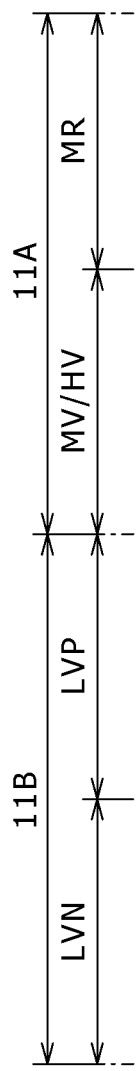
Figure 9F:
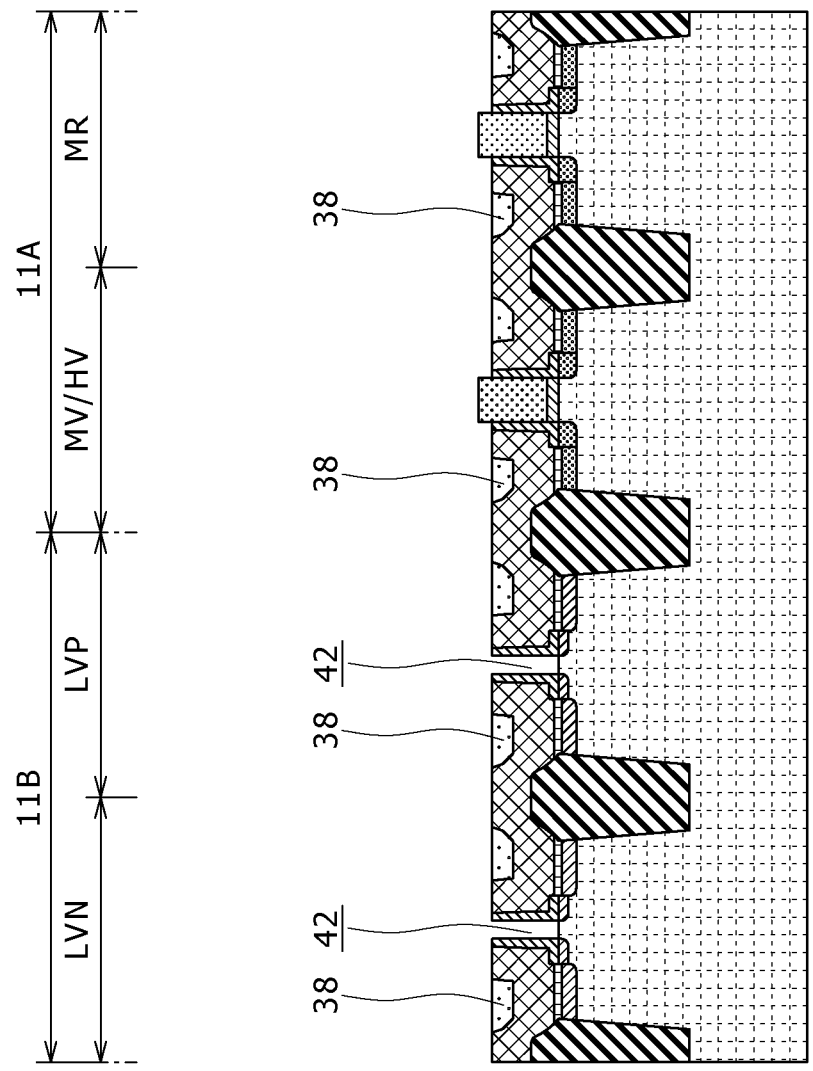
Figure 9G:
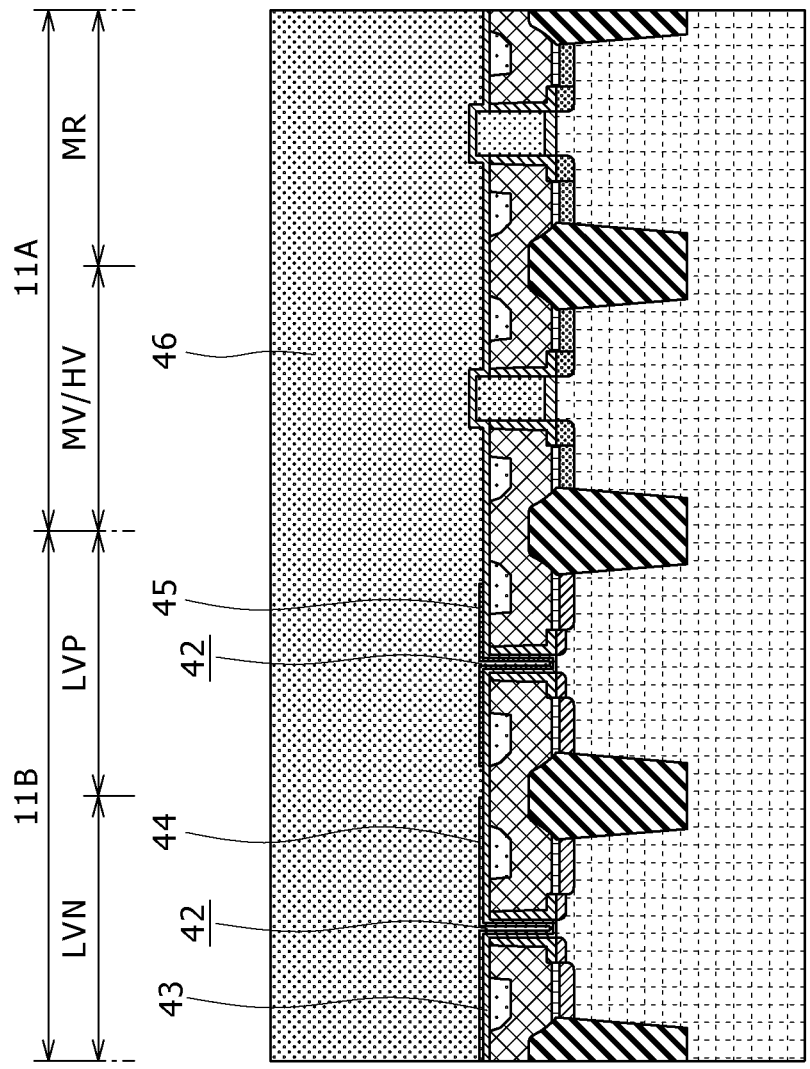
Figure 10:
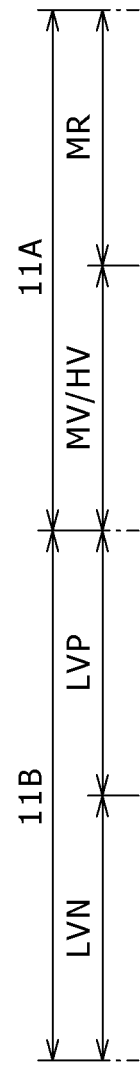
FIG. 10 is a schematically structural cross sectional view explaining an example of a problem in the method of manufacturing a semiconductor device in the related art.
Figure 10:
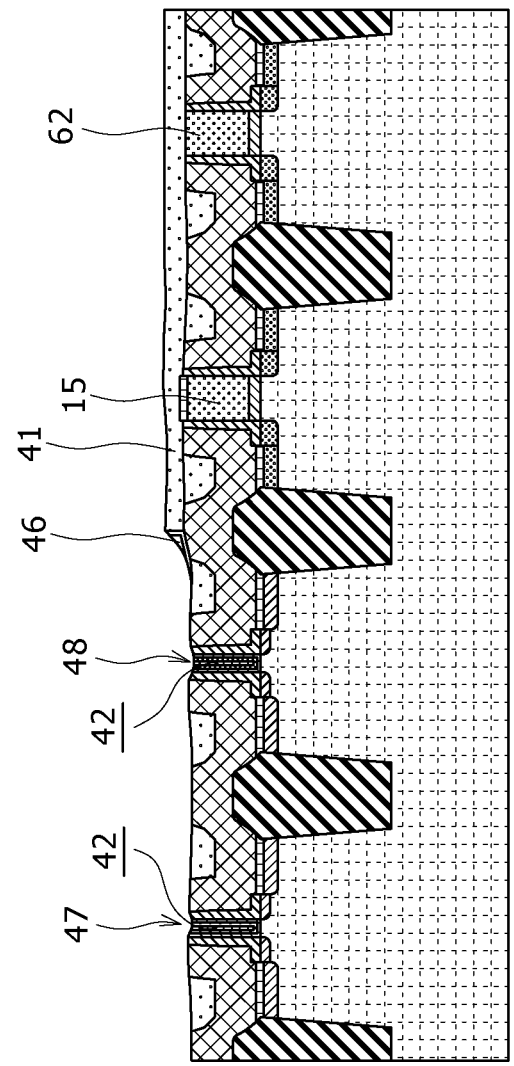

Next, as shown in FIG. 8N, the connection holes 52 to the respective silicide layers 33 corresponding to the first gate electrode 15, the resistor main body 62, the second gate electrodes 47 and 48, and the source/drain regions 27 to 32 of the transistors so as to extend completely through the liner film 36, the first interlayer insulating film 38, the protective film 49, and the second interlayer insulating film 51. It is noted that since FIG. 8N is a cross sectional view, an illustration of a part of the connection holes is omitted for the sake of simplicity. Next, a conductive film is formed on the second interlayer insulating film 51 so as to be filled in each of the connection holes 52. The conductive film, for example, is made of tungsten (W). The CVD method, for example, is utilized as a method of depositing the conductive film.

Next, a portion of the conductive layer overlying the second interlayer film 51 is removed by utilizing either the CMP method or the dry etching method, so that each of the electrodes 54 is formed from the conductive film left in each of the insides of the connection holes 52. Although not illustrated, thereafter, the wiring process is carried out.

In the manner described above, the middle-voltage transistor (N-channel MISFET)/high-voltage transistor (N-channel MISFET) is formed in the region MV/HV of the first region 11A. The resistor 3 is formed in the region MR of the first region 11A. Also, the low-voltage transistors (N-channel MISFETs) 4 are densely formed in the region LVN-1 of the second region 11B, the low-voltage transistor (N-channel MISFET) 4 is formed in isolation in the region LVN-2 thereof, and the low-voltage transistor (P-channel MISFET) 5 is formed in the region LVN thereof. In such a manner, the semiconductor device 1 is formed.

With the method of manufacturing the semiconductor device, the resistor protecting layer 63 is formed in the upper portion of the silicon based material layer 71 in the region in which the resistor main portion 62 is formed before the first gate electrode 15 is formed from the silicon based material layer 71. After that, after the resistor main portion 62 is formed from the silicon based material layer 71 having the upper portion in which the resistor protecting layer 63 formed, the second gate electrodes 47 and 48 are formed. Therefore, even when the extra portions, of the metal based gate materials (of which the work function controlling films 44 and 45, and the conductive film 46 are made, respectively), which are generated when the second gate electrodes 47 and 48 are formed so as to be filled in the trenches 42 for gate formation, respectively, are removed by performing the polishing such as the CMP, or the etching, the resistor main body 62 is prevented from being trimmed because its upper portion is prevented by the resistor protecting layer 63. As a result, even when the second gate electrodes 47 and 48 are made of the metallic gate materials (of which the work function controlling films 44 and 45, and the conductive film 46 are made, respectively), respectively, the resistance value of the resistor main body 62 can be held at desired one. In addition, controlling the thickness of the resistor protecting layer 63 makes it possible to control the resistance value of the resistor main body 62 to desired one.

Thus, the second gate electrodes 47 and 48 can be made of the metallic gate materials (of which the work function controlling films 44 and 45, and the conductive film 46 are made, respectively), respectively, and also the resistor main body 62 is prevented from being trimmed in the process for forming the second gate electrodes 47 and 48. This leads to that the resistance value of the resistor main body 62 can be held at desired one. Accordingly, there is an advantage that the resistor 3 can be formed to have the precise resistance value.

In addition, the protective film for covering the entire first region 11A side is not formed in the process for making the second gate electrodes 47 and 48 of the metallic gate materials (of which the work function controlling films 44 and 45, and the conductive film 46 are made, respectively), respectively. Accordingly, it is possible to suppress that the metal system gate materials are left after completion of the CMP process for the metal system gate materials to become the residue.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, said semiconductor device including (a) a first group of transistors, (b) a second group of transistors each having a lower operating voltage than that of each of said transistors in said first group, and (c) a resistor formed on a semiconductor substrate, said first group of transistors having first gate electrodes each of which is formed from a silicon based material layer on said semiconductor substrate having a first gate insulating film, said second group of transistors having second gate electrodes formed such that metal based gate materials are respectively filled in trenches for gate formation, the trenches formed by removing dummy gate portions on said semiconductor substrate having a second gate insulating film, and said resistor having a resistor main body comprising said silicon based material layer formed on an insulating film that is formed to constitute the same layer as that of said first gate insulating film, said manufacturing method comprising the steps of:

forming a resistor protecting layer in an upper portion of said silicon based material layer from which said resistor main body is formed;

removing (a) a hard mask layer on each of the first gate electrodes and dummy gate portions through a polishing step that uses said resistor protecting layer as a polishing stopper such that the first gate electrodes and dummy gate portions are exposed and said resistor main body is not exposed, and (b) said silicon based material layer from which said dummy gate portions are formed, thereby forming the trenches, and forming said second gate electrodes.

2. The method of manufacturing a semiconductor device according to claim 1, wherein after said second gate electrodes are formed, a protective film is formed on each of said second gate electrodes, and a silicidization process is carried out by using said protective film and said resistor protecting layer as a mask for the silicidization process, thereby forming a silicide layer on each of said first gate electrodes.

3. The method of manufacturing a semiconductor device according to claim 1, wherein said resistor protecting layer is constituted by an oxide layer which is formed by performing a cluster ion implantation of oxygen or carbon dioxide.

* * * * *

UNITED STATES PATENT AND TRADEMARK OFFICE
CERTIFICATE OF CORRECTION

PATENT NO. : 8,557,655 B2  
APPLICATION NO. : 13/027655  
DATED : October 15, 2013  
INVENTOR(S) : Harumi Ikeda Page 1 of 1

It is certified that error appears in the above-identified patent and that said Letters Patent is hereby corrected as shown below:

Title Page:

(62) "Division of application No. 12/182,614 filed Jul. 3, 2008, now Pat. No. 8,436,424"

should be

(62) --Division of application No. 12/182,614 filed Jul. 30, 2008, now Pat. No. 8,436,424--

Signed and Sealed this  
First Day of April, 2014

Michelle K. Lee  
*Deputy Director of the United States Patent and Trademark Office*